United States Patent
Wang et al.

(10) Patent No.: US 12,392,844 B2
(45) Date of Patent: Aug. 19, 2025

(54) TEST SYSTEM AND METHOD FOR POWER CONVERSION DEVICES, ELECTRONIC DEVICE, AND STORAGE MEDIUM

(71) Applicant: CONTEMPORARY AMPEREX TECHNOLOGY (HONG KONG) LIMITED, Hong Kong (CN)

(72) Inventors: Chunfa Wang, Ningde (CN); Yanming Zhao, Ningde (CN); Zhimin Dan, Ningde (CN); Yu Yan, Ningde (CN); Yuan Yao, Ningde (CN); Xiao Wang, Ningde (CN); Xiyang Zuo, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 234 days.

(21) Appl. No.: 18/310,065

(22) Filed: May 1, 2023

(65) Prior Publication Data
US 2023/0384395 A1    Nov. 30, 2023

Related U.S. Application Data

(63) Continuation of application No. PCT/CN2022/101835, filed on Jun. 28, 2022.

(51) Int. Cl.
G01R 31/40    (2020.01)
H02M 1/00     (2007.01)
H02M 7/44     (2006.01)

(52) U.S. Cl.
CPC .......... G01R 31/40 (2013.01); H02M 1/0067 (2021.05); H02M 7/44 (2013.01)

(58) Field of Classification Search
None
See application file for complete search history.

(56) References Cited

U.S. PATENT DOCUMENTS

| 5,675,483 A | 10/1997 | Rademaker |
| 2009/0140680 A1 | 6/2009 | Park |

(Continued)

FOREIGN PATENT DOCUMENTS

| CN | 201238203 Y | 5/2009 |
| CN | 201479019 U | 5/2010 |

(Continued)

OTHER PUBLICATIONS

First Office Action of CN application No. 202110877278.7, dated Mar. 1, 2023.

(Continued)

Primary Examiner — Nasima Monsur
(74) Attorney, Agent, or Firm — Ladas & Parry LLP

(57) ABSTRACT

System and method for testing power conversion devices are provided. A power supply grid is connected to an AC terminal of a first power conversion device, the power supply grid is also connected to an AC terminal of the second power conversion device, and a DC terminal of the first power conversion device is connected to a DC terminal of the second power conversion device. In this way, a test loop is formed by the power supply grid, the first power conversion device and the second power conversion device. In this test loop, the first power conversion device and the second power conversion device act as a load and a power source, so no additional DC power supply and load are required during the test.

11 Claims, 6 Drawing Sheets

(56) References Cited

U.S. PATENT DOCUMENTS

| | | | |
|---|---|---|---|
| 2010/0182809 A1 | 7/2010 | Cullinane et al. | |
| 2013/0208519 A1* | 8/2013 | Yamamoto | H02M 7/48 363/67 |
| 2014/0268935 A1* | 9/2014 | Chiang | H02M 7/217 363/49 |
| 2019/0140680 A1 | 5/2019 | Gerszberg et al. | |
| 2020/0191879 A1 | 6/2020 | Hsu et al. | |
| 2020/0264239 A1* | 8/2020 | Jimichi | H02M 3/33576 |
| 2020/0366126 A1* | 11/2020 | Lai | H02J 9/068 |

FOREIGN PATENT DOCUMENTS

| | | |
|---|---|---|
| CN | 101834527 A | 9/2010 |
| CN | 203537240 U | 4/2014 |
| CN | 206149013 U | 5/2017 |
| CN | 107696863 A | 2/2018 |
| CN | 110341517 A | 10/2019 |
| CN | 110896245 A | 3/2020 |
| JP | 2004104891 A | 4/2004 |
| JP | 2016214030 A | 12/2016 |
| JP | 6844618 B2 | 4/2021 |
| TW | 200419884 A | 10/2004 |

OTHER PUBLICATIONS

Second Office Action of CN application No. 202110877278.7, dated Aug. 18, 2023.
Written Opinion of International Search Authority for International Application PCT/CN2022/101835, dated Sep. 22, 2022.
A "Power Electronics Technology", ISBN No. 978-7-5646-3177-2 Edition, Editor-in-chief He Hucheng, China Mining University Press, Aug. 31, 2016, p. 129, Chapter 5 AC-AC conversion circuit.
International Search Report for PCT Application No. PCT/CN2022/101835, mailed Sep. 28, 2022.
Decision to Grant a Patent for JP application No. 2023-524167, dated Oct. 15, 2024.
Request for the Submission of an Opinion for KR application No. 10-2023-7014059, dated Aug. 12, 2024.
The Third Office Action of CN application No. 202110877278.7, dated Dec. 15, 2023.
Notification to Grant Patent Right of CN application No. 202110877278.7, dated Jan. 19, 2024.
Extended European search report for EP application No. 22851767.8, dated May 8, 2024.
Notice of Reasons for Refusal, JP application No. 2023-524167, dated May 28, 2024.
Notice of Allowance, KR application No. 10-2023-7014059, dated Apr. 17, 2025.

* cited by examiner

TEST SYSTEM AND METHOD FOR POWER CONVERSION DEVICES, ELECTRONIC DEVICE, AND STORAGE MEDIUM

CROSS-REFERENCE TO RELATED APPLICATIONS

The present application is a continuation of International Patent Application No. PCT/CN2022/101835, filed on Jun. 28, 2022, which claims priority to Chinese Patent Application No. 202110877278.7, filed on Jul. 31, 2021. The disclosures of the aforementioned patent applications are incorporated herein by reference in their entirety.

TECHNICAL FIELD

The embodiments of the present application relate to the technical field of aging test, and in particular, to a test system and method for power conversion devices, an electronic device, and a storage medium.

BACKGROUND

The replacement of fuel vehicles by electric vehicles has become a trend in the development of the automobile industry. Among the electric vehicles sold each year, the proportion of new energy vehicles continues to rise. To use the new energy vehicles as energy storage units in the grid to eliminate the peaks and fill the valleys, the demand for power conversion devices is becoming more and more prominent. The power conversion device refers to a bidirectional AC (alternating current)/DC (direct current), which can convert an AC power from the grid into a DC power and output it to and charge the battery of an electric vehicle, and can also convert a DC power of an electric vehicle into an AC power and feed it back to the grid.

In order to ensure the reliability of the power conversion device and avoid early failure caused by the defects of the material itself, the power conversion device needs to be subjected to 100% aging test. In related art, a DC power supply and a load need to be provided for power conversion devices to be aged. If a large number of power conversion devices are aged at the same time, a large number of DC power supplies need to be used, causing large investment cost and energy consumption.

SUMMARY

In view of the above problems, embodiments of the present application provide a test system and method for power conversion devices, an electronic device and a storage medium, which have low test investment cost and low energy consumption.

According to a first aspect of the embodiments of the present application, a test system for power conversion devices is provided. The test system includes: a first AC input/output section, configured to connect a power supply grid and an AC terminal of a first power conversion device; a second AC input and output section, configured to connect the power supply grid and an AC terminal of a second power conversion device, where a DC terminal of the first power conversion device is connected to a DC terminal of the second power conversion device; a control unit, configured to control the first power conversion device and the second power conversion device to work simultaneously in different working modes; and an evaluation unit, configured to obtain test data when the first power conversion device and the second power conversion device work in different working modes, and evaluate the first power conversion device and the second power conversion device according to the test data.

Through the above solution, the first power conversion device and the second power conversion device are paired, which can both act as a load and a power source. That is, one power conversion device to be tested can be used as a power supply and load for the other power conversion device to be tested. Therefore, no additional DC power supply and load are required during the test, thus saving the investment cost and conserving electricity because the system itself consumes less energy. In addition, the first power conversion device and the second power conversion device work simultaneously in different working modes in the same test loop, so the aging test can be performed on the first power conversion device and the second power conversion device at the same time, which improves the test efficiency. Furthermore, since no additional DC power supply is required in the test system, the device occupies less space, and the stability of the test system is not affected.

In some embodiments, the working modes include a first working mode and a second working mode. The first power conversion device works in the first working mode, and the second power conversion device works in the second working mode; or, the first power conversion device works in the second working mode, and the second power conversion device works in the first working mode.

Through the above solution, the first power conversion device and the second power conversion device work simultaneously in different working modes in the same test loop, so the aging test can be performed on the first power conversion device and the second power conversion device at the same time, which improves the test efficiency.

In some embodiments, the control unit includes: a relay control board and a plurality of relays, where the plurality of relays are arranged on the relay control board. The first power conversion device and the second power conversion device are respectively connected to different relays, and the relays are configured to switch the communication of the first power conversion device and the second power conversion device.

Through the above solution, the first power conversion device and the second power conversion device are respectively connected to different relays, the communication state between the first power conversion device and the control unit and the communication state between the second power conversion device and the control unit are changed through the relays. The communication state is relatively simple to control, which improves the test efficiency of the power conversion device.

According to a second aspect of the embodiments of the present application, a test method for power conversion devices is provided. The method includes: connecting a power supply grid respectively to an AC terminal of a first power conversion device and an AC terminal of a second power conversion device; connecting a DC terminal of the first power conversion device to a DC terminal of the second power conversion device; controlling the first power conversion device and the second power conversion device to work simultaneously in different working modes; and obtaining test data when the first power conversion device and the second power conversion device work in different working modes, and evaluating the first power conversion device and the second power conversion device according to the test data.

Through the above solution, a test loop can be formed by the power supply grid, the first power conversion device and the second power conversion device. In this test loop, the grid, the first power conversion device and the second power conversion device can act as a load and a power source, so no additional DC power supply and load are required during the test, thus saving the investment cost and energy consumption. In addition, the first power conversion device and the second power conversion device work simultaneously in different working modes, so the test can be performed on the first power conversion device and the second power conversion device at the same time, which improves the test efficiency.

In some embodiments, the working modes include a first working mode and a second working mode. The first power conversion device works in the first working mode, and the second power conversion device works in the second working mode; or, the first power conversion device works in the second working mode, and the second power conversion device works in the first working mode.

Through the above solution, the first power conversion device and the second power conversion device work simultaneously in different working modes in the same test loop, so the aging test can be performed on the first power conversion device and the second power conversion device at the same time, which improves the test efficiency.

In some embodiments, the control unit includes: a relay control board and a plurality of relays, where the plurality of relays are arranged on the relay control board. The first power conversion device and the second power conversion device are respectively connected to different relays, and the relays are configured to switch the communication of the first power conversion device and the second power conversion device.

Through the above solution, the first power conversion device and the second power conversion device are respectively connected to different relays, the communication state between the first power conversion device and the control unit and the communication state between the second power conversion device and the control unit are changed through the relays. The communication state is relatively simple to control, which improves the test efficiency of the power conversion device.

In some embodiments, the controlling the first power conversion device and the second power conversion device to work simultaneously in different working modes includes: controlling the first power conversion device to undergo a first stage of charge and discharge in the first working mode, and controlling the second power conversion device to undergo a first stage of charge and discharge in the second working mode; and when the first stage of charge and discharge ends, controlling the first power conversion device to undergo a second stage of charge and discharge in the second work mode, and controlling the second power conversion device to undergo a second stage of charge and discharge in the first working mode.

Through the above solution, the control unit controls the first power conversion device and the second power conversion device to work simultaneously in different working modes, so the aging test can be performed on the first power conversion device and the second power conversion device at the same time, which improves the test efficiency.

In some embodiments, the controlling the first power conversion device to undergo a first stage of charge and discharge in the first working mode and controlling the second power conversion device to undergo a first stage of charge and discharge in the second working mode include: controlling a first relay corresponding to the first power conversion device to close and sending a first turn-on instruction to the first power conversion device, so that the first power conversion device undergoes the first stage of charge and discharge in the first working mode; and controlling the first relay to open, controlling a second relay corresponding to the second power conversion device to close, and sending a second turn-on instruction to the second power conversion device, so that the second power conversion device undergoes the first stage of charge and discharge in the second working mode.

Through the above solution, the control unit switches the communication of the first power conversion device and the second power conversion device through the relays, which is convenient for control and has high control efficiency. In addition, during the control, the first power conversion device is enabled to undergo the first stage of charge and discharge in the first working mode, and then the second power conversion device is enabled to undergo the first stage of charge and discharge in the second working mode. That is, the power is turned on first and then the load is turned on, so the operation safety is high.

In some embodiments, the controlling the first power conversion device to undergo a second stage of charge and discharge in the second working mode and controlling the second power conversion device to undergo a second stage of charge and discharge in the first working mode include: controlling the second power conversion device to stop the first stage of charge and discharge in the second working mode, and controlling the first power conversion device to stop the first stage of charge and discharge in the first working mode; sending a first turn-on instruction to the second power conversion device, so that the second power conversion device undergoes the second stage of charge and discharge in the first working mode; and sending a second turn-on instruction to the first power conversion device, so that the first power conversion device undergoes the second stage of charge and discharge in the second working mode.

Through the above solution, the second power conversion device is controlled to stop the first stage of charge and discharge in the second working mode, and then the first power conversion device is controlled to stop the first stage of charge and discharge in the first working mode, that is, the load is turned off first and then the power is turned off, so the operation safety is high. When the second stage of charge and discharge is enabled, the second power conversion device is enabled to undergo the second stage of charge and discharge in the first working mode, and then the first power conversion device is enabled to undergo the second stage of charge and discharge in the second working mode. That is, the power is turned on first and then the load is turned on, so the operation safety is high.

In some embodiments, the controlling the second power conversion device to stop the first stage of charge and discharge in the second working mode and controlling the first power conversion device to stop the first stage of charge and discharge in the first working mode include: controlling the second relay corresponding to the second power conversion device to close and sending a first turn-off instruction to the second power conversion device, so that the second power conversion device stops the first stage of charge and discharge in the second working mode; and controlling the second relay to open, controlling the first relay corresponding to the first power conversion device to close, and sending a second turn-off instruction to the first power conversion device, so that the first power conversion device stops the first stage of charge and discharge in the first working mode.

Through the above solution, the control unit switches the communication of the first power conversion device and the second power conversion device through the relays, which is convenient for control and has high control efficiency. The second power conversion device is controlled to stop the first stage of charge and discharge in the second working mode, and then the first power conversion device is controlled to stop the first stage of charge and discharge in the first working mode, that is, the load is turned off first and then the power is turned off, so the operation safety is high.

In some embodiments, the obtaining test data when the first power conversion device and the second power conversion device work in different working modes and evaluating the first power conversion device and the second power conversion device according to the test data include: obtaining first charge and discharge data and determining whether the first power conversion device and the second power conversion device are abnormal in the first stage of charge and discharge according to the first charge and discharge data, where the first charge and discharge data is the test data when the first power conversion device undergoes the first stage of charge and discharge in the first working mode and the test data when the second power conversion device undergoes the first stage of charge and discharge in the second working mode; and obtaining second charge and discharge data and determining whether the first power conversion device and the second power conversion device are abnormal in the second stage of charge and discharge according to the second charge and discharge data, where the second charge and discharge data is the test data when the first power conversion device undergoes the second stage of charge and discharge in the second working mode and the test data when the second power conversion device undergoes the second stage of charge and discharge in the first working mode.

Through the above solution, whether the first power conversion device and the second power conversion device are abnormal in the first stage of charge and discharge can be determined according to the first charge and discharge data, and whether the first power conversion device and the second power conversion source are abnormal in the second stage of charge and discharge can be determined according to the second charge and discharge data. This facilitates the subsequent determination of whether the first power conversion device and the second power conversion device are failed products.

In some embodiments, the determining whether the first power conversion device and the second power conversion device are abnormal in the first stage of charge and discharge according to the first charge and discharge data includes: if the first charge and discharge data of the first power conversion device goes beyond a first threshold range, determining that the first power conversion device is abnormal in the first stage of charge and discharge; and If the first charge and discharge data of the second power conversion device goes beyond the first threshold range, determining that the second power conversion device is abnormal in the first stage of charge and discharge.

Through the above solution, when the first charge and discharge data of the first power conversion device goes beyond the first threshold range, it is determined that the first power conversion device is abnormal in the first stage of charge and discharge. When the first charge and discharge data of the second power conversion device goes beyond the first threshold range, it is determined that the second power conversion device is abnormal in the first stage of charge and discharge. The determination method is simple and easy to implement, which can improve the determination efficiency.

In some embodiments, the determining whether the first power conversion device and the second power conversion device are abnormal in the second stage of charge and discharge according to the second charge and discharge data includes: if the second charge and discharge data of the first power conversion device goes beyond a second threshold range, determining that the first power conversion device is abnormal in the second stage of charge and discharge; and If the second charge and discharge data of the second power conversion device goes beyond the second threshold range, determining that the second power conversion device is abnormal in the second stage of charge and discharge.

Through the above solution, when the second charge and discharge data of the first power conversion device goes beyond the second threshold range, it is determined that the first power conversion device is abnormal in the second stage of charge and discharge. When the second charge and discharge data of the second power conversion device goes beyond the second threshold range, it is determined that the second power conversion device is abnormal in the second stage of charge and discharge. The determination method is simple and easy to implement, which can improve the determination efficiency.

According to a third aspect of the embodiments of the present application, a computer-readable storage medium storing a computer program is provided. When the computer program is executed by a processor, the test method for power conversion devices according to the second aspect is implemented.

According to a fourth aspect of the embodiments of the present application, an electronic device is provided, including: a processor; and a memory for storing instructions executable by the processor, where the processor is configured to implement the test method for power conversion devices according to the second aspect by executing the executable instructions.

In the embodiments of the present application, the power supply grid is connected to the AC terminal of the first power conversion device, the power supply grid is also connected to the AC terminal of the second power conversion device, and the DC terminal of the first power conversion device is connected to the DC terminal of the second power conversion device. In this way, a test loop is formed by the power supply grid, the first power conversion device and the second power conversion device. After that, the control unit can control the first power conversion device and the second power conversion device to work simultaneously in different working modes, and the evaluation unit can obtain the test data of the first power conversion device and the second power conversion device when they work in different working modes, and evaluate the first power conversion device and the second power conversion device according to the test data. In this test loop, the first power conversion device and the second power conversion device can act as a load and a power source, so no additional DC power supply and load are required during the test, thus saving the investment cost and energy consumption. In addition, in the same test loop, the first power conversion device and the second power conversion device work simultaneously, so the aging test can be performed on the first power conversion device and the second power conversion device at the same time, which improves the test performance. efficiency.

The above description is only a summary of the technical solutions in the embodiments of the present application. In order to be able to understand the technical means provided in the embodiments of the present application more clearly, the technical means can be implemented according to the content of the specification. Furthermore, to make the above and other objectives, features and advantages in the embodiments of the present application more comprehensible, specific implementations of the present application are exemplified below.

BRIEF DESCRIPTION OF DRAWINGS

By reading the detailed description of the preferred implementations below, various other advantages and benefits will become apparent to those of ordinary skill in the art. The drawings are for the purpose of illustrating the preferred embodiments only and are not to be considered a limitation to the present application. Moreover, in all of the drawings, the same parts are indicated by the same reference numerals. In the drawings.

DETAILED DESCRIPTION

Figure 1:
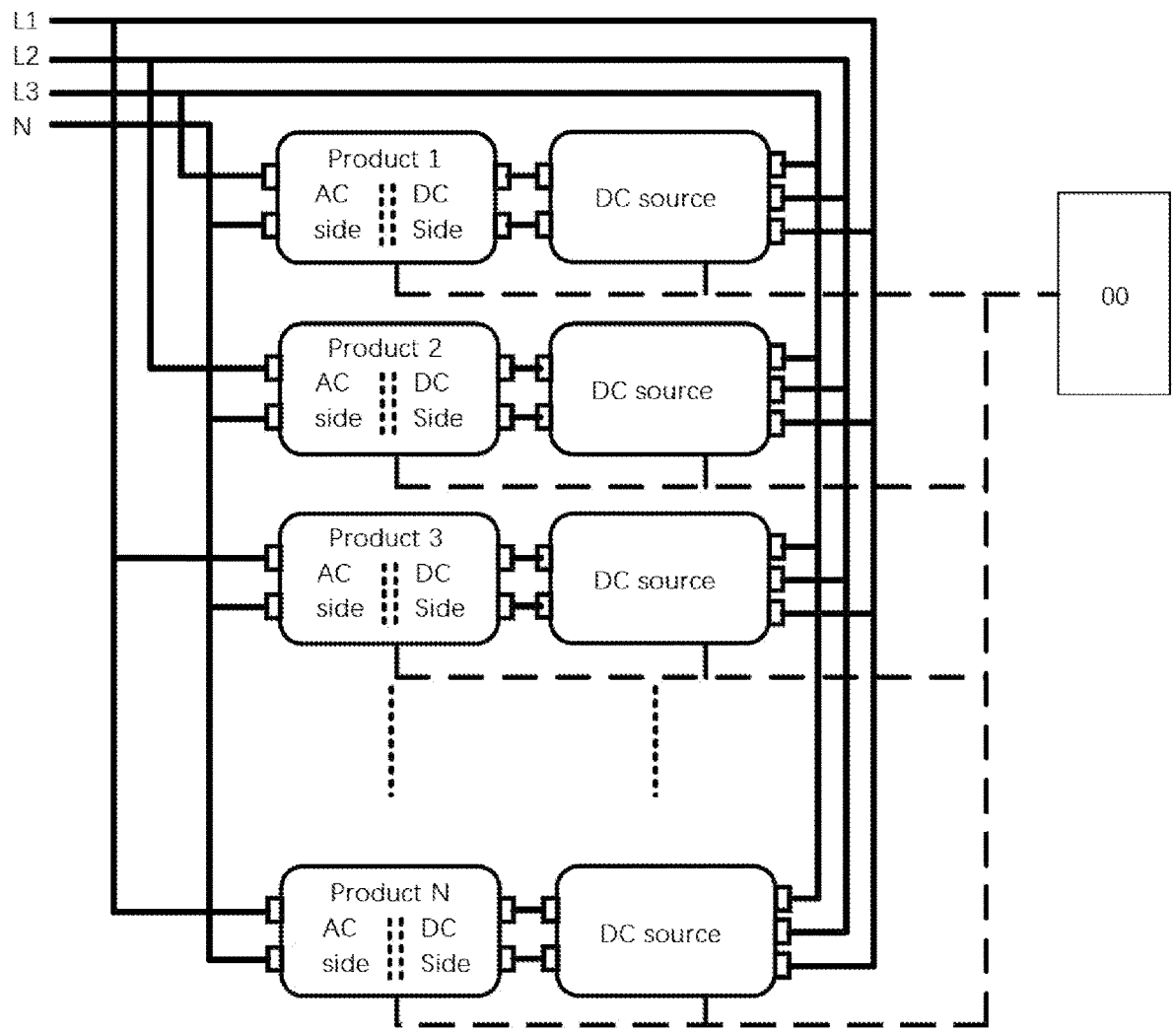
FIG. 1 is a schematic structural diagram of a test system for power conversion devices in the related art.

Embodiments of the technical solutions of the present application will be described in detail below in conjunction with the drawings. The following embodiments are merely provided for more clearly illustrating the technical solutions of the present application, and therefore are exemplary and cannot be construed as limiting the scope of protection of the present application.

Unless otherwise defined, all technical and scientific terms used herein have the same meaning as commonly understood by those skilled in the art belonging to the technical field of the present application. The terms used herein are only for the purpose of describing specific embodiments and are not intended to limit the present application. The terms "including" and "having" and any variations thereof in the specification, claims, and the description of drawings of the present application are intended to cover non-exclusive inclusion.

In the description of the embodiments of the present application, the technical terms "first", "second", and the like are used only to distinguish between different objects, and are not to be understood as indicating or implying a relative importance or implicitly specifying the number, particular order, or primary and secondary relation of the technical features indicated. In the description of the embodiments of the present application, "a plurality of" means two or more, unless otherwise explicitly and specifically defined.

Reference herein to "an embodiment" means that a particular feature, structure, or characteristic described in connection with the embodiment can be included in at least one embodiment of the present application. The appearance of this phrase anywhere in the specification does not necessarily refer to the same embodiment, or a separate or alternative embodiment that is mutually exclusive with other embodiments. It is explicitly and implicitly understood by those skilled in the art that the embodiments described herein may be combined with other embodiments.

In the description of the embodiments of the present application, the term "and/or" is simply a description of an association of associated objects, which indicates that there may exist three relationships, for example, A and/or B may mean: the presence of A, the presence of both A and B, and the presence of B. In addition, the character "/" herein generally means that the associated objects before and after it are in an "or" relationship.

In the description of the embodiments of the present application, the term "a plurality of" refers to two or more (including two), and similarly, "multiple groups" refers to two or more (including two) groups, and "multiple sheets" refers to two or more (including two) sheets.

In the description of the embodiments of the present application, the orientation or position relationship indicated by the technical terms "central", "longitudinal", "transverse", "length", "width", "thickness", "upper," "lower," "front," "back," "left," "right," "vertical," "horizontal," "top," "bottom," "inner," "outer," "clockwise," "counterclockwise," "axial", "radial", and "circumferential", etc. are based on the orientation or position relationship shown in the drawings and are intended to facilitate the description of the embodiments of the present application and simplify the description only, rather than indicating or implying that the device or element referred to must have a particular orientation or be constructed and operated in a particular orientation. Therefore, they are not to be interpreted as limitations on the embodiments of the present application.

In the description of the embodiments of the present application, unless otherwise expressly specified and limited, the technical terms "mount," "join," "connect," and "fix," etc. should be understood in a broad sense, such as, a fixed connection, a detachable connection, or an integral connection; a mechanical connection, or an electrical connection; a direct connection, an indirect connection through an intermediate medium, an internal connection of two elements, or interaction between two elements. For those of ordinary skill in the art, the specific meanings of the above terms in the embodiments of the present application can be understood according to specific situations.

In order to ensure the reliability of the power conversion device and avoid early failure caused by the defects of the material itself, the power conversion device needs to be subjected to 100% aging test. The test in the present application can be understood as an aging test.

In the related art, in a schematic structure of a test system for the power conversion device in the related art as shown in FIG. 1, a DC terminal of the power conversion device is often connected to one terminal of a DC power supply, and an AC terminal of the power conversion device and the other terminal of the DC power supply are both connected to a grid to form a test loop. The DC terminal of the power conversion device refers to the DC side of the power conversion device in FIG. 1, the DC power supply refers to the DC source in FIG. 1, and the AC terminal of the power conversion device refers to the AC side of the power conversion device in FIG. 1. A control unit 00 controls each power conversion device to work in different working modes, so as to perform an aging test on the power conversion device. When the power conversion device works in a first working mode, the DC power supply acts as an electronic load of the power conversion device, and the first working mode refers to an AC input and DC output mode. When the power conversion device works in a second working mode, the DC power supply acts as a DC power supply of the power conversion device, and the second working mode refers to a DC input and AC output mode. FIG. 1 shows a plurality of power conversion devices, which are marked as product 1, product 2, product 3, . . . , product N in sequence in FIG. 1.

It can be seen that in the related art, when the power conversion device is subjected to an aging test, an additional DC power supply needs to be connected to provide the DC power and the load. Especially in the case of large-scale test, a large number of DC power supplies are needed and control software for DC power supplies needs to be developed. A 10 kW DC power supply is estimated to cost 100,000 yuan. If 150 power conversion devices need to be tested at the same time to meet the demand for production capacity, then 150 DC power supplies are required, and 15 million yuan needs to be invested to purchase the DC power supplies. The investment cost is very large, and the energy consumption is also very large. In addition, one test loop can only be used to test one power conversion device, and the test efficiency is low. Furthermore, the volume of the DC power supply is 500 mm*500 mm*800 mm, which occupies a large space, resulting in a large space for the equipment in the test system and poor economic benefits.

In view of this, an embodiment of the present application provides a test system for power conversion devices. A power supply grid is connected to an AC terminal of a first power conversion device, the power supply grid is also connected to an AC terminal of a second power conversion device, and a DC terminal of the first power conversion device is connected to a DC terminal of the second power conversion device. In this way, a test loop is formed by the power supply grid, the first power conversion device and the second power conversion device. Then, a control unit 3 can control the first power conversion device and the second power conversion device to work simultaneously in different working modes, and an evaluation unit 4 can obtain the test data of the first power conversion device and the second power conversion device when they work in different working modes, and evaluate the first power conversion device and the second power conversion device according to the test data.

In the test loop in the present application, the first power conversion device and the second power conversion device are paired, which can both act as a load and a power source. That is, one power conversion device to be tested can be used as a power supply and load for the other power conversion device to be tested. Therefore, no additional DC power supply and load are required during the test, thus saving the investment cost and conserving electricity because the system itself consumes less energy. In addition, the first power conversion device and the second power conversion device work simultaneously in different working modes in the same test loop, so the aging test can be performed on the first power conversion device and the second power conversion device at the same time, which improves the test efficiency. Furthermore, since no additional DC power supply is required in the test system, the device occupies less space, and the stability of the test system is not affected.

Some test data is provided below for easy comparison. Assuming that the efficiency of the power conversion device is 93%, the efficiency of the DC power supply as an electronic load is 70%, and the efficiency of the DC power supply as a power supply is 80%; and the working in the first working mode and the second working mode is respectively 5 hrs.

In the related art, the system efficiency $P1=93\%*70\%=65.1\%$ when the power conversion device works in the first working mode, and the system efficiency $P2=93\%*80\%=74.4\%$ when the power conversion device works in the second working mode. It can be seen that the system efficiency of the test system of the power conversion device in the related art is $P=(P1+P2)/2=69.75\%$.

In the present application, the system efficiency $P1=93\%*93\%=86.49\%$ when the first power conversion device works in the first working mode and the second power conversion device works in the second working mode, and the system efficiency $P2=93\%*93\%=86.49\%$ when first power conversion device works in the second working mode and the second power conversion device works in the first working mode. It can be seen that the system efficiency of the test system for the power conversion device in the present application is $P=(P1+P2)/2=86.49\%$.

It can be easily found through comparison that the efficiency of the test system for the power conversion device provided in the embodiment of the present application is 16.74% higher than that of the test system for the power conversion device in the related art (86.49%−69.75%=16.74%). It can be seen that the test system for the power conversion device provided in the present application effectively improves the system efficiency.

Figure 2:
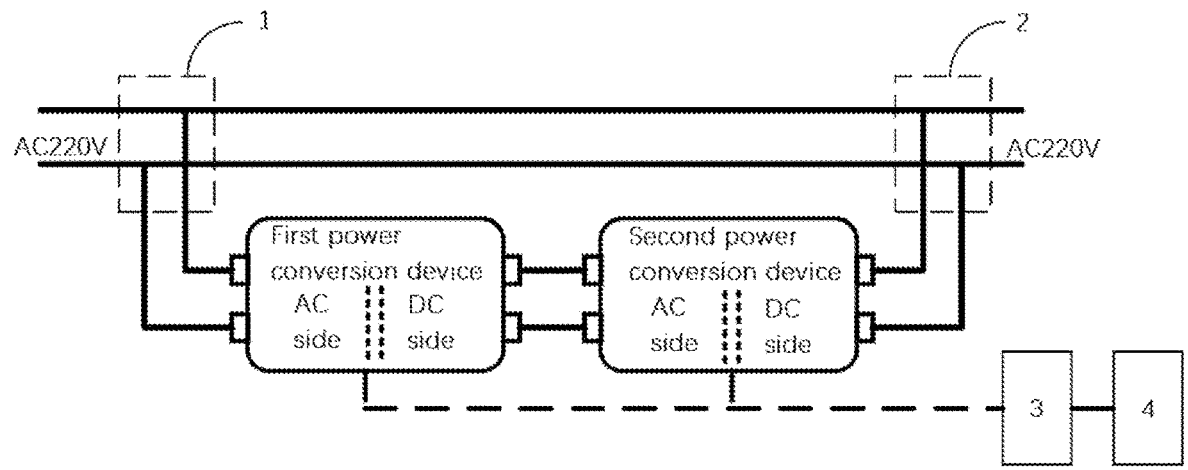
FIG. 2 is a schematic structural diagram of a test system for power conversion devices according to an embodiment of the present application.

The test system for the power conversion device provided in the embodiments of the present application will be described in detail below with reference to FIGS. 2 to 5. FIG. 2 is a schematic structural diagram of a test system for power conversion devices according to an embodiment of the present application. As shown in FIG. 2, the test system includes: a first AC input/output section 1, a second AC input/output section 2, a first power conversion device, a second power conversion device, a control unit 3 and an evaluation unit 4. The first AC input/output section 1 is configured to connect a power supply grid and an AC terminal of the first power conversion device, the second AC input/output section 2 is configured to connect the power supply grid and an AC terminal of the second power conversion device. A DC terminal of the first power conversion device is connected to a DC terminal of the second power conversion device. The control unit 3 is configured to control the first power conversion device and the second power conversion device to work simultaneously in different working modes. The evaluation unit 4 is configured to obtain the test data of the first power conversion device and the second power conversion device when they work in different working modes, and evaluate the first power conversion device and the second power conversion device according to the test data.

It should be noted that the first power conversion device and the second power conversion device are bidirectional AC/DC conversion devices. On the one hand, they can act as a load to receive an AC power and convert the received AC power into a DC power, and then act as a power source to output the DC power. On the other hand, they can act as a load to receive a DC power and convert the received DC power into an AC power, and then act as a power source to output the AC power. That is to say, the first power conversion device and the second power conversion device can act as a load and a power source, and can not only receive the AC power and output the DC power, but also receive the DC power and output the AC power.

In addition, the first AC input/output section 1 and the second AC input/output section 2 may be an AC input/output interface. The power supply grid is connected to the AC terminal of the first power conversion device through the first AC input/output section 1, the power supply grid is connected to the AC terminal of the second power conversion device through the second AC input/output section 2, and then the DC terminal of the first power conversion device is connected to the DC terminal of the second power conversion device. In this way, a test loop is formed by the power supply grid, the first power conversion device and the second power conversion device. The DC terminal of the first power conversion device is connected to the DC terminal of the second power conversion device, and this connection mode may be referred to as a back-to-back connection mode.

After the test loop is formed, in some examples, the grid may act as a power source to output an AC power to the first power conversion device. The first power conversion device can act as a load to receive an AC power from the grid and convert the received AC power into a DC power, and then act as a power source to output the converted DC power to the second power conversion device. The second power conversion device can act as a load to receive the DC power from the first power conversion device and convert the received DC power into an AC power, and then act as a power source to output the converted AC power to the grid. The grid may act as a load to receive the AC power output by the second power conversion device.

In some examples, the grid may act as a power source to output an AC power to the second power conversion device. For example, the grid can provide a 220V AC power, which can be abbreviated as AC220V as shown in FIG. 2. The second power conversion device can act as a load to receive the AC power from the grid and convert the received AC power into a DC power, and then act as a power source to output the converted DC power to the first power conversion device. The first power conversion device can act as a load to receive the DC power from the second power conversion device and convert the received DC power into an AC power, and then act as a power source to output the converted AC power to the grid. The grid may act as a load to receive the AC power output by the first power conversion device.

In the above two examples, the grid can act as a power source to output an AC power to the first power conversion device or the second power conversion device, and can also act as a load to receive the AC power from the second power conversion device or the second power conversion device.

Furthermore, the working mode includes a first working mode and a second working mode. The first working mode may be an AC input and DC output mode, and the second working mode may be a DC input and AC output mode.

The control unit 3 is connected to the first power conversion device and the second power conversion device, respectively. The control unit 3 can control the first power conversion device to work in the first working mode, and control the second power conversion device to work in the second working mode. Alternatively, the control unit 3 can also control the first power conversion device to work in the second working mode, and control the second power conversion device to work in the first working mode. In short, the control unit 3 controls the first power conversion device and the second power conversion device to work simultaneously in different working modes. The work may be charge and discharge. For example, the power conversion device working in the first working mode means that the power conversion device undergoes AC charge and DC discharge in the first working mode, and the power conversion device working in the second working mode means that the power conversion device undergoes DC charge and AC discharge in the second working mode.

Finally, the evaluation unit 4 has a data processing function. The evaluation unit 4 is connected to the first power conversion device and the second power conversion device respectively through the control unit 3. The evaluation unit 4 can obtain test data when the first power conversion device works in the first working mode and the second working mode, and evaluate the first power conversion device according to the test data. The evaluation unit 4 can also obtain test data when the second power conversion device works in the first working mode and the second working mode, and evaluate the second power conversion device according to the test data.

The test data may be the aging data of the first power conversion device and the second power conversion device under certain test conditions. Therefore, the evaluation unit 4 can evaluate the aging performance of the first power conversion device based on the test data of the first power conversion device, so as to determine whether the first power conversion device is abnormal. Similarly, the evaluation unit 4 can evaluate the aging performance of the second power conversion device based on the test data of the second power conversion device, so as to determine whether the second power conversion device is abnormal.

In the embodiments of the present application, the power supply grid is connected to the AC terminal of the first power conversion device, the power supply grid is also connected to the AC terminal of the second power conversion device, and the DC terminal of the first power conversion device is connected to the DC terminal of the second power conversion device. In this way, a test loop is formed by the power supply grid, the first power conversion device and the second power conversion device. Then, the control unit 3 can control the first power conversion device and the second power conversion device to work simultaneously in different working modes, and the evaluation unit 4 can obtain the test data of the first power conversion device and the second power conversion device when they work in different working modes, and evaluate the first power conversion device and the second power conversion device according to the test data. In this test loop, the first power conversion device and the second power conversion device can act as a load and a power source, so no additional DC power supply and load are required during the test, thus saving the investment cost and energy consumption. In addition, in the same test loop, the first power conversion device and the second power conversion device work simultaneously, so the aging test can be performed on the first power conversion device and the second power conversion device at the same time, which improves the test performance. efficiency.

In some embodiments, the control unit 3 may include: a relay control board and a plurality of relays. The plurality of relays are arranged on the relay control board. The first power conversion device and the second power conversion device are respectively connected to different relays, and the relays are configured to switch the communication of the first power conversion device and the second power conversion device.

It should be noted that the first power conversion device is connected to a corresponding relay, and the communication of the first power conversion device can be switched through the relay corresponding to the first power conversion device. The second power conversion device is connected to a corresponding relay, and the communication of the second power conversion device can be switched through the relay corresponding to the second power conversion device. For ease of control, the relays may be numbered, and the numbers of the relays may correspond to their corresponding power conversion devices. For example, the relay corresponding to the first power conversion device may be numbered as the first relay, and the relay corresponding to the second power conversion device may be numbered as the second relay.

The switching the communication of the first power conversion device means changing the communication state between the first power conversion device and the control unit 3. The switching the communication of the second power conversion device means changing the communication state between the second power conversion device and the control unit 3. For example, when the first relay is controlled to close, the communication state between the first power conversion device and the control unit 3 can be switched from non-communication to communication, and when the first relay is controlled to open, the communication state between the first power conversion device and the control unit 3 can be switched from communication to non-communication. When the second relay is controlled to close, the communication state between the second power conversion device and the control unit 3 can be switched from non-communication to communication, and when the second relay is controlled to open, the communication state between the second power conversion device and the control unit 3 can be switched from communication to non-communication.

It is to be noted that to meet production needs, hundreds of products often need to be aged at a time. The traditional method is to add a controller area network CAN card between the control unit 3 and each power conversion device. That is to say, the CAN card is in one-to-one correspondence to the power conversion device, and the control unit 3 controls the communication with the power conversion device corresponding to the CAN card through the CAN card. The method is quite costive. However, in the present application, only one CAN card needs to be set between the control unit 3 and the relay board, where a plurality of relays are set on the relay board. The plurality of relays are connected to corresponding power conversion devices, and the control unit 3 switches the relays or controls the opening and closing of the relays through the CAN card, to change the communication state with each power conversion device, which effectively reduces the cost, is relatively simple to control, and improves the test efficiency of the power conversion device. In addition, the number of relays set on the relay board can be expanded. Therefore, the test system of the present application can be expanded, that is, the number of power conversion devices to be tested at the same time can be easily expanded.

The test system for power conversion devices shown in the embodiment of FIG. 2 above includes a group of power conversion devices, and this group of power conversion devices includes two back-to-back serially connected power conversion devices, that is, the first power conversion device and the second power conversion device in FIG. 2. In the embodiment of FIG. 2, aging test can be performed on two power conversion devices at the same time. However, in practice, aging test often needs to be performed on a large number of power conversion devices. In order to simultaneously perform aging test on a large number of power conversion devices, the embodiments of the present application further provide three other test systems for power conversion devices. The three test systems for power conversion devices will be described in detail below with reference to FIG. 3, FIG. 4 and FIG. 5.

Figure 3:
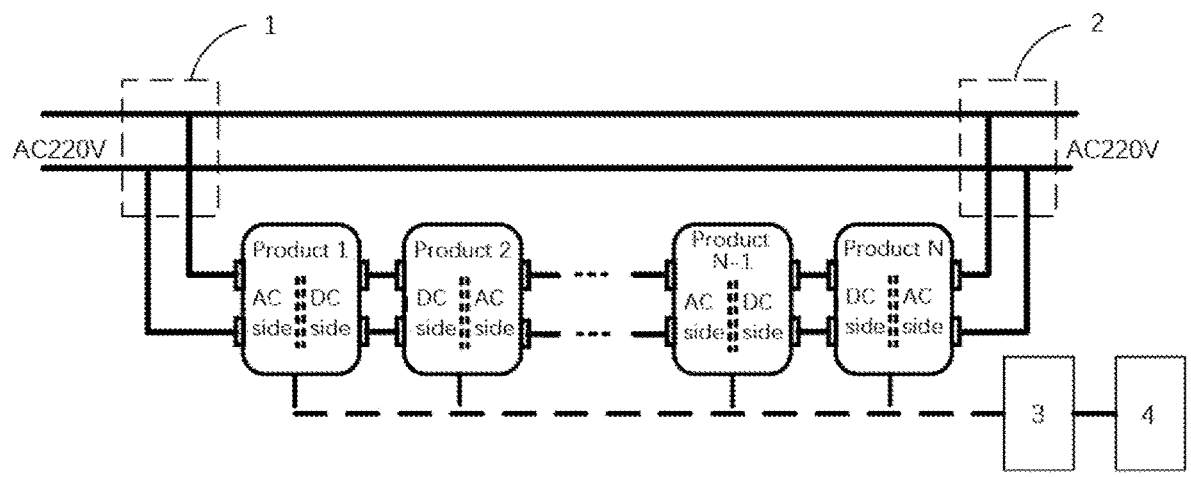
FIG. 3 is a schematic structural diagram of another test system for power conversion devices according to an embodiment of the present application.

FIG. 3 is a schematic structural diagram of a test system for power conversion devices provided in an embodiment of the present application. Similar to the test system for power conversion devices shown in the embodiment of FIG. 2, the test system also includes: a first AC input/output section 1, a second AC input/output section 2, a control unit 3 and an evaluation unit 4, and the test system also includes a group of power conversion devices. However, unlike the test system for power conversion devices shown in the embodiment of FIG. 2 that one group of power conversion devices in the test system shown in the embodiment of FIG. 2 includes a pair of power conversion devices and the pair of power conversion devices includes two back-to-back serially connected power conversion devices, one group of power conversion devices in the test system shown in the embodiment of FIG. 3 includes multiple pairs of power conversion devices and each pair of power conversion devices in the multiple pairs of power conversion devices includes two back-to-back serially connected power conversion devices. FIG. 3 shows a plurality of power conversion devices, which are marked as product 1, product 2, product N−1, . . . , product N in sequence in FIG. 3. In view of this, the group of power conversion devices in the test system shown in the embodiment of FIG. 3 may include 4, 6, 8 or more even number of power conversion devices. However, due to the energy consumption of the power conversion devices, to ensure that all power conversion devices can run at full power during the aging test to meet the aging test conditions, a group of power conversion devices should not include too many power conversion devices.

In this embodiment, the first AC input/output section 1 is configured to connect a power supply grid and an AC terminal of a first power conversion device in the back-to-back serially connected sequence in this group of power conversion devices, such as the AC side of product 1 in FIG. 3., and the second AC input/output section 2 is configured to connect the power supply grid and an AC terminal of a last power conversion device in the back-to-back serially connected sequence in this group of power conversion devices, such as the AC side of product N in FIG. 3. In this embodiment, DC terminals of two power conversion devices in each pair of power conversion devices in the back-to-back serially connected sequence are connected to each other, and AC terminals of two adjacent power conversion devices of two adjacent pairs of power conversion devices are connected to each other.

Exemplarily, assuming that the test system shown in FIG. 3 includes two pairs of, or four power conversion devices. The four power conversion devices are numbered in a back-to-back serially connected sequence. The first one is called the first power conversion device, the second one is called the second power conversion device, the third one is called the third power conversion device, and the fourth one is called the fourth power conversion device. The first power conversion device and the second power conversion device are two adjacent power conversion devices in the first pair of power supply devices, the third power conversion device and the fourth power conversion device are two adjacent power conversion devices in the second pair of power conversion devices, and the second power conversion device and the third power conversion device are two adjacent power conversion devices of the two adjacent pairs of power conversion devices. The first AC input/output section 1 is configured to connect a power supply grid and an AC terminal of the first power conversion device, and the second AC input/output section 2 is configured to connect the power supply grid and an AC terminal of the fourth power conversion device. A DC terminal of the first power conversion device is connected to a DC terminal of the second power conversion device, an AC terminal of the second power conversion device is connected to an AC terminal of the third power conversion device, and a DC terminal of the third power conversion device is connected to a DC terminal of the fourth power conversion device.

The control unit 3 is configured to control the odd-numbered and the even-numbered power conversion devices in the serially connected sequence in this group of power conversion devices to work simultaneously in different working modes. The evaluation unit 4 is configured to obtain test data when the odd-numbered and even-numbered power conversion devices in the serially connected sequence in this group of power conversion devices work simultaneously in different working modes, and evaluate the group of power conversion devices according to the test data.

Further in the above example, the first power conversion device and the third power conversion device are the odd-numbered power conversion devices in the serially connected sequence in this group of power conversion devices, and the second power conversion device and the fourth power conversion device are the even-numbered power conversion devices in the serially connected sequence in this group of power conversion devices. Then the control unit 3 can control the first power conversion device and the third power conversion device to work in the first working mode, and control the second power conversion device and the fourth power conversion device to work in the second working mode. Alternatively, it can control the first power conversion device and the third power conversion device to work in the second working mode, and control the second power conversion device and the fourth power conversion device to work in the first working mode. The evaluation unit 4 can obtain test data when a target power conversion device works in the first working mode and the second working mode, and evaluate the target power conversion device according to the test data. The target power conversion device is any one of the four power conversion devices.

Figure 4:
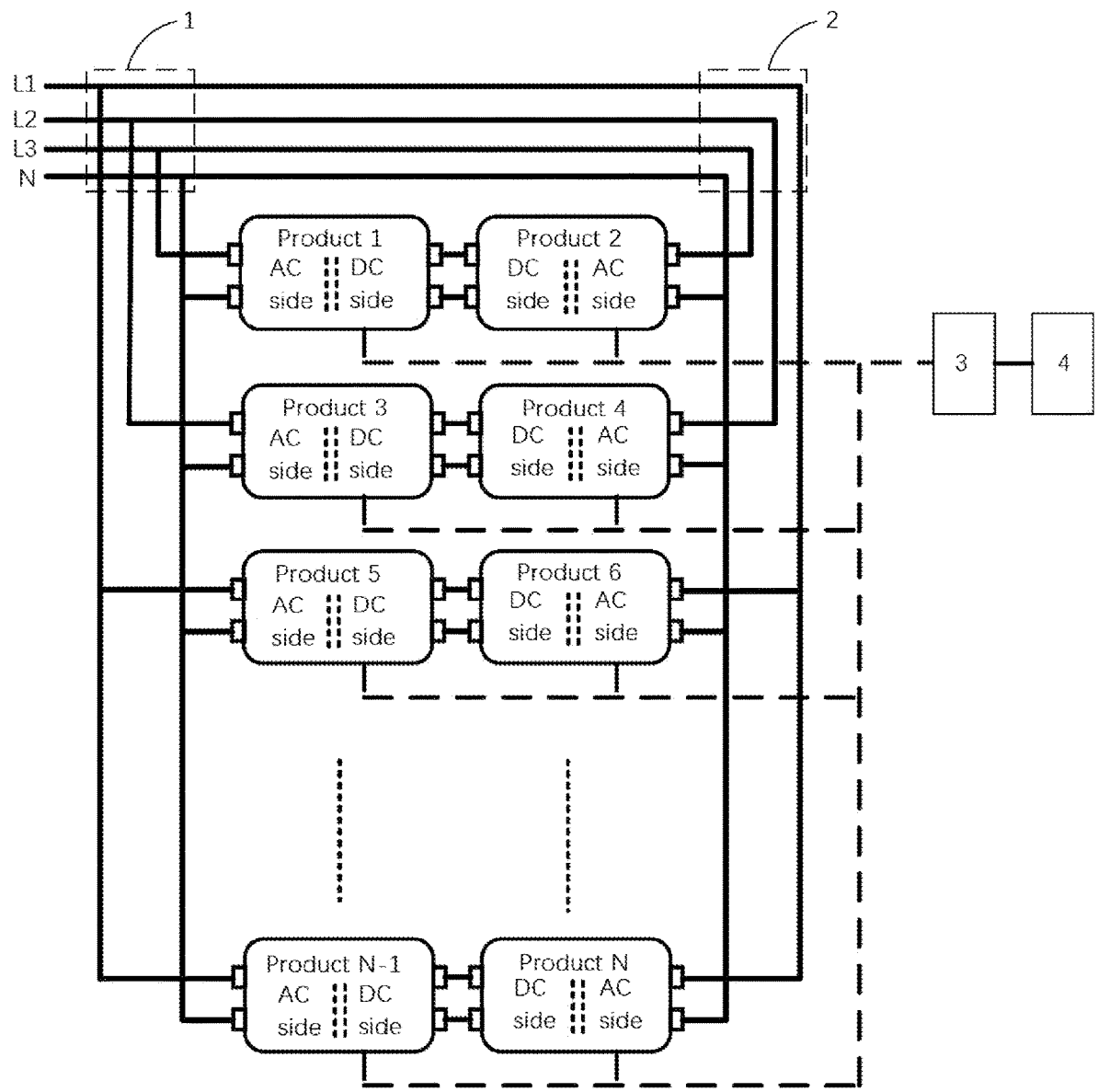
FIG. 4 is a structural schematic diagram of another test system for power conversion devices according to an embodiment of the present application.

FIG. 4 is a schematic structural diagram of a test system for power conversion devices provided in an embodiment of the present application. As shown in FIG. 4, similar to the test system for power conversion devices shown in the embodiment of FIG. 2, the test system also includes: a first AC input/output section 1, a second AC input/output section 2, a control unit 3 and an evaluation unit 4. However, unlike the test system for power conversion devices shown in the embodiment of FIG. 2 that the test system shown in the embodiment of FIG. 2 includes one group of power conversion devices, the test system shown in the embodiment of FIG. 4 includes multiple groups of power conversion devices. Each group of power conversion devices in the multiple groups of power conversion devices includes two back-to-back serially connected power conversion devices as shown in the embodiment of FIG. 2. FIG. 4 shows a plurality of power conversion devices, which are marked as product 1, product 2, product N–1, . . . , product N in sequence in FIG. 4. It should be noted that due to the need for aging test on a large number of power conversion devices, to balance the grid, the test system adopts a three-phase power supply, and L1, L2, L3 and N in FIG. 4 represent a three-phase four-wire system.

In this embodiment, the first AC input/output section 1 is configured to connect a power supply grid and an AC terminal of a first power conversion device in each group of power conversion devices in the multiple groups of power conversion devices, and the second AC input/output section 2 is configured to connect the power supply grid and an AC terminal of a second power conversion device in each group of power conversion devices. A DC terminal of the first power conversion device in each group of power conversion devices is connected to a DC terminal of the second power conversion device.

Exemplarily, it is assumed that the test system shown in FIG. 4 includes two groups of power conversion devices, and each group of power conversion devices includes two back-to-back serially connected power conversion devices. The four power conversion devices included in the test system of the power conversion devices are numbered as a first power conversion device in a first group of power conversion devices, a second power conversion device in the first group of power conversion devices, a first power conversion device in a second group of power conversion devices, and a second power conversion device in the second group of power conversion devices. The first AC input/output section 1 is configured to connect the power supply grid and an AC terminal of the first power conversion device in the first group of power conversion devices, and the first AC input/output section 1 is also configured to connect the power supply grid and an AC terminal of the first power conversion device in the second group of power conversion devices. The second AC input/output section 2 is configured to connect the power supply grid and an AC terminal of the second power conversion device in the first group of power conversion devices, and the second AC input/output section 2 is also configured to connect the power supply grid and an AC terminal of the second power conversion device in the second group of power conversion devices. A DC terminal of the first power conversion device in the first group of power conversion devices is connected to a DC terminal of the second power conversion device in the first group of power conversion devices. A DC terminal of the first power conversion device in the second group of power conversion devices is connected to a DC terminal of the second power conversion device in the second group of power conversion devices.

The control unit 3 is configured to control the first power conversion device and the second power conversion device in each group of power conversion devices in the multiple groups of power conversion devices to work simultaneously in different working modes. The evaluation unit 4 is configured to obtain test data when the first power conversion device and the second power conversion device in each group of power conversion devices in the multiple groups of power conversion devices work simultaneously in different working modes, and evaluate the first power conversion device and the second power conversion device in each group of power conversion devices according to the test data.

Further in the example, the control unit 3 can control the first power conversion device in the first group of power conversion devices and the first power conversion device/second power conversion device in the second group of power conversion devices to work in the first working mode, and control the second power conversion device in the first group of power conversion devices and the second power conversion device/first power conversion device in the second group of power conversion devices to work in the second working mode. Alternatively, it can control the first power conversion device in the first group of power conversion devices and the first power conversion device/second power conversion device in the second group of power conversion devices to work in second first working mode, and control the second power conversion device in the first group of power conversion devices and the second power conversion device/first power conversion device in the second group of power conversion devices to work in the first working mode. For ease of control, when the test system includes multiple groups of power conversion devices, the odd-numbered power conversion devices in the serially connected sequence in each group of power conversion devices are usually controlled to work in one working mode, and the even-numbered power conversion devices in the serially connected sequence in each group of power conversion devices are controlled to work in another working mode.

The evaluation unit 4 can obtain test data when a target power conversion device works in the first working mode and the second working mode, and evaluate the target power conversion device according to the test data. The target power conversion device is any one of the four power conversion devices.

Figure 5:
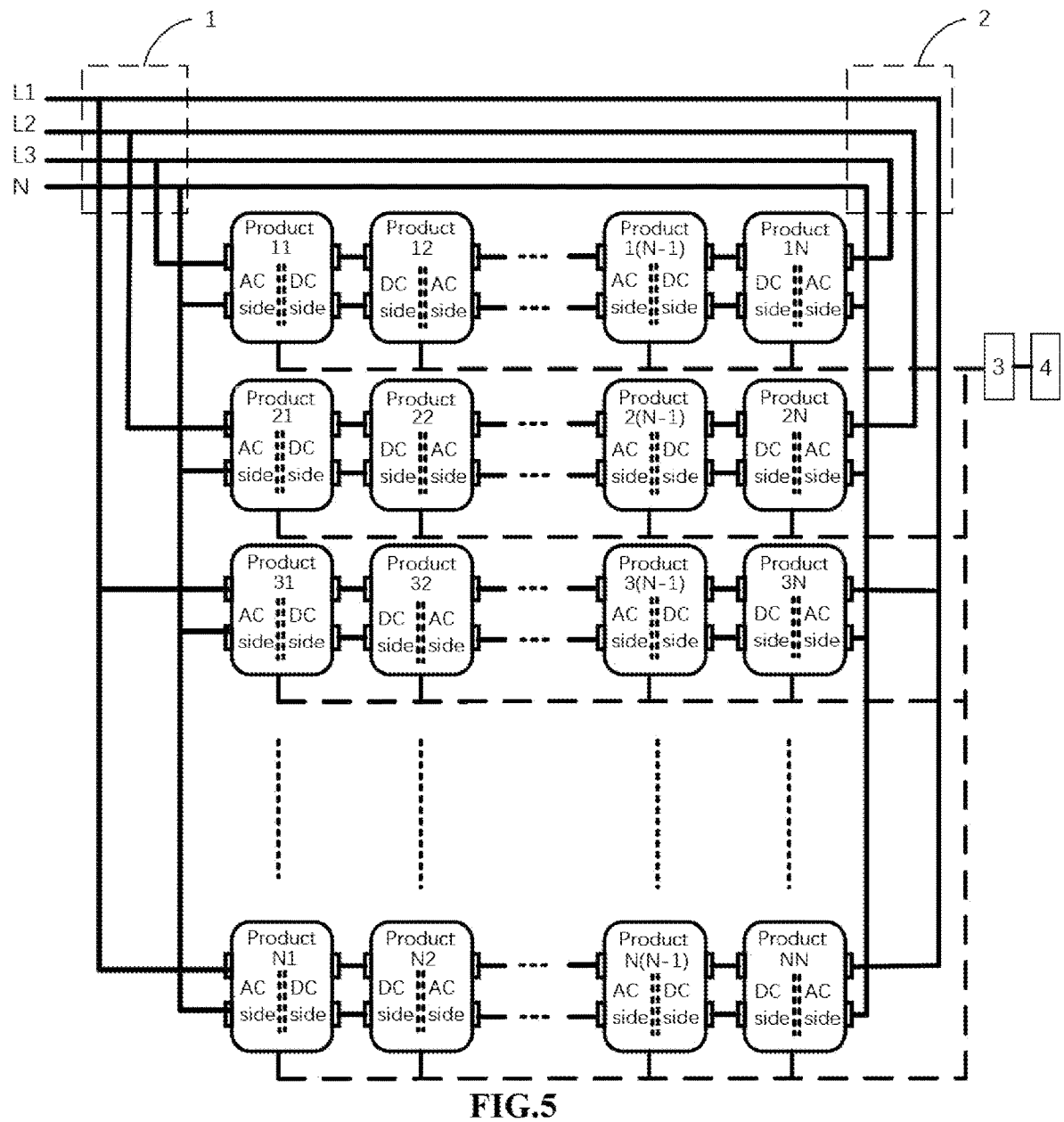
FIG. 5 is a structural schematic diagram of another test system for power conversion devices according to an embodiment of the present application.

FIG. 5 is a schematic structural diagram of a test system for power conversion devices provided in an embodiment of the present application. Similar to the test system for power conversion devices shown in the embodiment of FIG. 4, the test system also includes: a first AC input/output section 1, a second AC input/output section 2, a control unit 3, an evaluation unit 4, and multiple groups of power conversion devices. However, unlike the test system for power conversion devices shown in the embodiment of FIG. 4 where each group of power conversion devices in the test system shown in the embodiment of FIG. 4 includes a pair of power conversion devices and the pair of power conversion devices includes two back-to-back serially connected power conversion devices, each group of power conversion devices in the test system shown in the embodiment of FIG. 5 includes multiple pairs of power conversion devices and each pair of power conversion devices in the multiple pairs of power conversion devices includes two back-to-back serially connected power conversion devices, which is similar to the test system shown in the embodiment of FIG. 3 where one group of power conversion devices includes multiple pairs of power conversion devices. FIG. 5 shows a plurality of power conversion devices, which are marked as product 11, product 12, . . . , product 1 (N−1), product 1N, product 21, product 22, . . . , product 2 (N−1), product 2N, product N1, product N2, . . . , product N (N−1), and product NN.

In this embodiment, the first AC input/output section 1 is configured to connect a power supply grid and an AC terminal of a first power conversion device in the back-to-back serially connected sequence in each group of power conversion devices in the multiple groups of power conversion devices, and the second AC input/output section 2 is configured to connect an AC terminal of a last power conversion device in the back-to-back serially connected sequence in each group of power conversion devices. In this embodiment, back-to-back serial connection means that DC terminals of two power conversion devices in each pair of power conversion devices in each group of power conversion devices are connected to each other, and AC terminals of two adjacent power conversion devices of two adjacent pairs of power conversion devices in each group of power conversion devices are connected to each other.

Exemplarily, it is assumed that the test system shown in FIG. 5 includes two groups of power conversion devices, and each group of power conversion devices includes two pairs power conversion devices. The multiple power conversion devices included in the test system of the power conversion devices are numbered as a first power conversion device in a first group of power conversion devices, a second power conversion device in the first group of power conversion devices device, a third power conversion device in the first group of power conversion devices, and a fourth power conversion device in the first group of power conversion devices, a first power conversion device in a second group of power conversion devices, a second power conversion device in the second group of power conversion devices, a third power conversion device in the second group of power conversion devices, and a fourth power conversion device in the second group of power conversion devices. The first AC input/output section 1 is configured to connect the power supply grid and an AC terminal of the first power conversion device in the first group of power conversion devices, and the first AC input/output section 1 is also configured to connect the power supply grid and an AC terminal of the first power conversion device in the second group of power conversion devices. The second AC input/output section 2 is configured to connect the power supply grid and an AC terminal of the fourth power conversion device in the first group of power conversion devices, and the second AC input/output section 2 is also configured to connect the power supply grid and an AC terminal of the fourth power conversion device in the second group of power conversion devices. A DC terminal of the first power conversion device in the first group of power conversion devices is connected to a DC terminal of the second power conversion device in the first group of power conversion devices, an AC terminal of the second power conversion device in the first group of power conversion devices is connected to an AC terminal of the third power conversion device in the first group of power conversion devices, and a DC terminal of the third power conversion device in the first group of power conversion devices is connected to a DC terminal of the fourth power conversion device in the first group of power conversion devices. The connections between the four power conversion devices in the second group of power conversion devices are similar to the connections between the four power conversion devices in the first group of power conversion devices, and will not be described in detail here.

The control unit 3 is configured to control the odd-numbered and the even-numbered power conversion devices in the serially connected sequence in each group of power conversion devices in the multiple groups of power conversion devices to work simultaneously in different working modes. The evaluation unit 4 is configured to obtain test data of the odd-numbered and the even-numbered power conversion devices in the serially connected sequence in each group of power conversion devices in the multiple groups of power conversion devices when they work in different working modes, and evaluate each power conversion device in each group of power conversion devices according to the test data.

Further in the example, the control unit 3 can control the first power conversion device and the third power conversion device in the first group of power conversion devices and the first power conversion device and the third power conversion device in the second group of power conversion devices to work in the first/second working mode, and control the second power conversion device and the fourth power conversion device in the first group of power conversion devices and the second power conversion device and fourth power conversion device in the second group of power conversion devices to work in the second/first working mode. Of course, in addition to the above two control modes, the control unit 3 can also use other control modes to control the odd-numbered and the even-numbered power conversion devices in the serially connected sequence in each group of power conversion devices in the multiple groups of power conversion devices to work simultaneously in different working modes, which will not be listed here.

The evaluation unit 4 can obtain test data when a target power conversion device works in the first working mode and the second working mode, and evaluate the target power conversion device according to the test data. The target power conversion device is any one of the eight power conversion devices.

Figure 6:
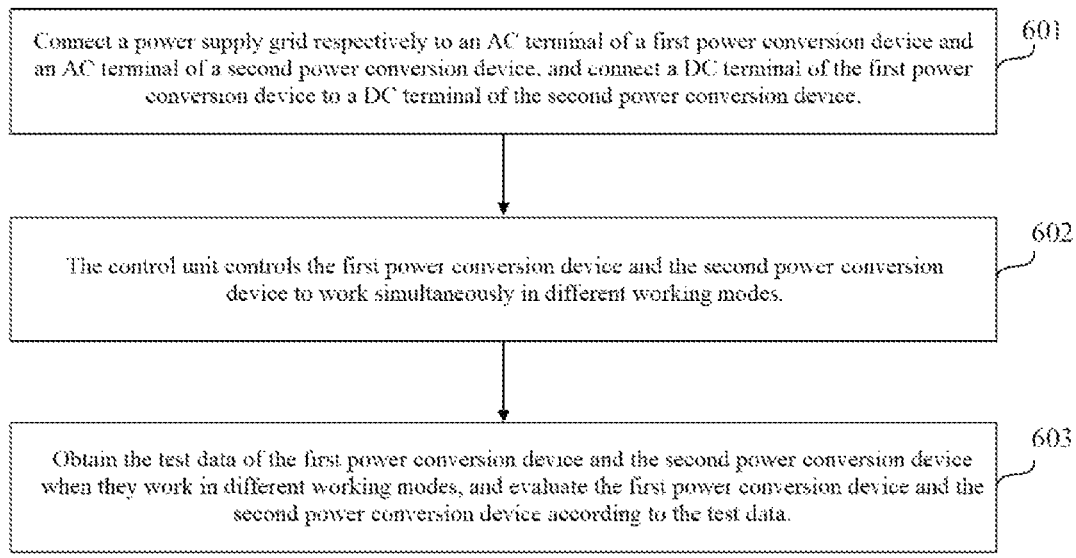
FIG. 6 is a flowchart of a test method for power conversion devices according to an embodiment of the present application.

Corresponding to the test system for power conversion devices shown in the embodiment of FIG. 2, the embodiment of the present application provides a test method for power conversion devices shown in the embodiment of FIG. 6. FIG. 6 is a schematic flow chart of a test method for power conversion devices provided in an embodiment of the present application. The steps of the method can be implemented by a host computer. As shown in FIG. 6, the method is as follows.

Step 601: Connect a power supply grid respectively to an AC terminal of a first power conversion device and an AC terminal of a second power conversion device, and connect a DC terminal of the first power conversion device to a DC terminal of the second power conversion device.

The power supply grid can be connected to the AC terminal of the first power conversion device through a first AC input/output section 1, and the power supply grid is connected to the AC terminal of the second power conversion device through a second AC input/output section 2. The first power conversion device, the second power conversion device, the first AC input/output section 1 and the second AC input/output section 2 have been described in the embodiment of FIG. 2, and will not be repeated here.

Through the above step, a test loop can be formed by the power supply grid, the first power conversion device and the second power conversion device. The first power conversion device and the second power conversion device are connected to the grid in a back-to-back manner. After the test loop is formed, a control unit 3 can control the grid to supply an AC power to the power conversion device by controlling an AC power contactor. Afterwards, the host computer tests the first power conversion device and the second power conversion device by means of the test loop.

Step 602: The control unit 3 controls the first power conversion device and the second power conversion device to work simultaneously in different working modes.

It should be noted that all power conversion devices including the first power conversion device and the second power conversion device in the test system have unique corresponding barcodes. The aging position on the aging vehicle where each power conversion device undergoes the aging test also has a unique corresponding barcode. After the host computer receives a startup instruction triggered by a user and starts the test system based on the startup instruction, it can receive the barcode of each power conversion device and the barcode corresponding to the aging position on the aging vehicle input by the user, and display all the received barcodes for check by the technicians.

The working modes include a first working mode and a second working mode. When this step is implemented, for example, the control unit 3 can control the first power conversion device to work in the first working mode based on the barcode corresponding to the first power conversion device and the barcode corresponding to the aging position of the first power conversion device, and control the second power conversion device to work in the second working mode based on the barcode corresponding to the second power conversion device and the barcode corresponding to the aging position of the second power conversion device. Alternatively, the control unit 3 can also control the first power conversion device to work in the second working mode, and control the second power conversion device to work in the first working mode.

It is to be noted that the control unit 3 can control the first power conversion device to work in the first working mode and control the second power conversion device to work in the second working mode; and then control the first power conversion device to work in the second working mode, and control the second power conversion device to work in the first working mode. Of course, the control unit 3 can also control the first power conversion device to work in the second working mode and control the second power conversion device to work in the first working mode; and then control the first power conversion device to work in the first working mode, and control the second power conversion device to work in the second working mode. This is not limited in the embodiment of the present application.

When the control unit 3 controls the first power conversion device and the second power conversion device to work simultaneously in different working modes, an exemplary implementation is described in Steps (1) and (2) by way of example in which the first power conversion device is controlled to work in the first working mode and the second power conversion device is controlled to work in the second working mode; and then the first power conversion device is controlled to work in the second working mode, and the second power conversion device is controlled to work in the first working mode.

Step (1): The first power conversion device is controlled by the control unit 3 to undergo a first stage of charge and discharge in the first working mode, and the second power conversion device is controlled to undergo a first stage of charge and discharge in the second working mode.

In some examples, the control unit 3 may include a relay control board and a plurality of relays. The plurality of relays are arranged on the relay control board. The first power conversion device and the second power conversion device are respectively connected to corresponding relays, so the control unit 3 can switch the communication of the first power conversion device and the second power conversion device through the relays. Exemplarily, when Step (1) is performed, a first relay corresponding to the first power conversion device is controlled to close, and a first turn-on instruction is sent to the first power conversion device, to enable the first power conversion device to undergo the first stage of charge and discharge in the first working mode. Then, the first relay is controlled to open, a second relay corresponding to the second power conversion device is controlled to close, and a second turn-on instruction is sent to the second power conversion device, to enable the second power conversion device to undergo the first stage of charge and discharge in the second working mode.

It should be noted that the first working mode is an AC input and DC output mode, and the second working mode is a DC input AC output mode. The power conversion device working in the first working mode is equivalent to a power supply for the power conversion device working in the second working mode. The power conversion device working in the second working mode is equivalent to a load for the power conversion device working in the first working mode. For the sake of safe operation, generally a principle of turning on the power first and then turning on the load is followed. Therefore, the first power conversion device is enabled to undergo the first stage of charge and discharge in the first working mode, and then the second power conversion device is enabled to undergo the first stage of charge and discharge in the second working mode.

After the first relay corresponding to the first power conversion device is closed, the communication state between the first power conversion device and the control unit 3 is switched from non-communication to communication, so that the control unit 3 can send the first turn-on instruction to the first power conversion device. The first turn-on instruction may be an instruction preset in the host computer for enabling the first power conversion device to work in the first working mode. For example, the first turn-on instruction may be ID180180A0 instruction 61009411000009411 and instruction 65009411D0079411.

After the first power conversion device is enabled to work in the first working mode, the first relay is opened and the second relay is closed, so that the communication state between the first power conversion device and the control unit 3 is switched from communication to non-communication, and the communication state between the second power conversion device and the control unit 3 is switched from non-communication to communication. As a result, the control unit 3 can send a second turn-on instruction to the second power conversion device. The second turn-on instruction may be an instruction preset in the host computer for enabling the second power conversion device to work in the second working mode. For example, the second turn-on instruction may be ID180180A0 instruction E100941100009411 and instruction E5009411DC059411.

Through Step (1), the first power conversion device and the second power conversion device can undergo the first stage of charge and discharge in different working modes. When the first power conversion device works in the first working mode based on the first turn-on instruction, it can receive an AC power from the grid, convert the AC power into a DC power and output it to the second power conversion device. When the second power conversion device works in the second working mode based on the second turn-on instruction, it can receive the DC power output from the first power conversion device, convert the DC power into an AC power and output it to the grid.

In some embodiments, when the first power conversion device is controlled to undergo the first stage of charge and discharge in the first working mode and the second power conversion device is controlled to perform the first stage of charge and discharge in the second working mode in Step (1), first charge and discharge data can be obtained, and whether the first power conversion device and the second power conversion device are abnormal during the first stage of charge and discharge is determined according to the first charge and discharge data, This part will be described in Step 6031 later, and will not be detailed here.

However, if it is determined through Step 6031 that the first power conversion device is abnormal during the first stage of charge and discharge, to save unnecessary energy consumption, Step (2) may not be performed to control the first power conversion device to undergo a second stage of charge and discharge in the second working mode. Moreover, when the first power conversion device is abnormal during the first stage of charge and discharge, the first power conversion device cannot provide a power or act as a load for the second power conversion device, and the second power conversion device cannot be tested normally. Therefore, the second power conversion device has no need to be controlled to undergo a second stage of charge and discharge in the first working mode through Step (2). That is to say, if the first power conversion device is abnormal during the first stage of charge and discharge, the first stage of charge and discharge is stopped to end the aging test, and Step (2) is not performed. Similarly, if it is determined in Step 6031 that the second power conversion device is abnormal during the first stage of charge and discharge, the first stage of charge and discharge is stopped to end the aging test, and Step (2) is not performed. The operation of stopping the first stage of charge and discharge to end the aging test will be described in detail in Step (2) below.

Step (2): The first power conversion device is controlled to undergo a second stage of charge and discharge in the second working mode and the second power conversion device is controlled to undergo a second stage of charge and discharge in the first working mode by the control unit 3 when the first stage of charge and discharge ends.

It should be noted that generally during the aging test, each power conversion device needs to work in the first working mode/second working mode for a period of time, and then work in the second working mode/first working mode for a period of time. The duration of the first stage of charge and discharge can be half of the duration of the total test. For example, the duration of the first stage of charge and discharge can be 5 h. Then Step (2) can be performed after the first power conversion device is charged and discharged for 5 h in the first working mode and the second power conversion device is charged and discharged in the second working mode for 5 h. In combination with the above description, in this embodiment, Step (2) is performed to continue the aging test when it is determined that neither the first power conversion device nor the second power conversion device is abnormal during the first stage of charge and discharge, and the first stage of charge and discharge is completed.

In some embodiments, if it is determined that the first power conversion device and/or the second power conversion device is/are abnormal during the first stage of charge and discharge, the abnormality is marked. For example, if it is determined that the first power conversion device and/or the second power conversion device is/are abnormal during the first stage of charge and discharge, the first data flag bit is set to 1. A first data flag bit of 0 indicates that there is no abnormality. Generally, the host computer will set the data flag bit to 0 after starting the test system, and the first data flag bit is used to mark the abnormality during the first stage of charge and discharge. Moreover, during the first stage of the charge and discharge test, if there is an abnormality, a technician can press the stop button to trigger a test stop instruction. Correspondingly, the host computer receives the test stop instruction, and record the test stop event through the first data flag bit. For example, if the first data flag bit is currently 1, the upper computer may not modify the first data flag bit. If the first data flag bit is currently 0, the host computer can set the first data flag bit to 1. In combination with the above description, in this embodiment, Step (2) is performed to undergo the second stage of charge and discharge and continue the aging test when it is determined that the first data flag bit is 0, and the first stage of charge and discharge is completed. Otherwise, the aging test is stopped.

In some examples, when Step (2) is performed, the second power conversion device is controlled to stop the first stage of charge and discharge in the second working mode, and then the first power conversion device is controlled to stop the first stage of charge and discharge in the first working mode. Then, a first turn-on instruction is sent to the second power conversion device, to enable the second power conversion device to undergo the second stage of charge and discharge in the first working mode. Finally, a second turn-on instruction is sent to the first power conversion device, to enable the first power conversion device to undergo the second stage of charge and discharge in the second working mode.

Notably, it is pointed out in Step (1) that for the sake of safe operation, the principle of turning on the power first and then turning on the load is generally followed. When the power is turned off, the principle of turning off the load first and then turning off the power is generally followed. Therefore, in Step (2), the second power conversion device is controlled to stop the first stage of charge and discharge in the second working mode, then the first power conversion device is controlled to stop the first stage of charge and discharge in the first working mode, then the second power conversion device is controlled to undergo the second stage of charge and discharge in the first working mode, and finally the first power conversion device is controlled to undergo the second stage of charge and discharge in the second working mode.

When the second power conversion device is controlled to stop the first stage of charge and discharge in the second working mode and the first power conversion device is controlled to stop the first stage of charge and discharge in the first working mode, the second relay corresponding to the second power conversion device is controlled to close, and the communication state between the second power conversion device and the control unit 3 is switched from non-communication to communication, so that the control unit 3 can send a first turn-off instruction to the second power conversion device to enable the second power conversion device to stop the first stage of charge and discharge in the second working mode. The first turn-off instruction may be an instruction preset in the host computer for enabling the second power conversion device to stop working in the second working mode. For example, the first turn-off instruction may be ID180180A0 instruction E2009411000009411.

Then, the second relay is controlled to open, the first relay corresponding to the first power conversion device is controlled to close, and the communication state between the first power conversion device and the control unit 3 is switched from non-communication to communication, so that the control unit 3 can send a second turn-off instruction to the first power conversion device to enable the first power conversion device to stop the first stage of charge and discharge in the first working mode. The second turn-off instruction may be an instruction preset in the host computer for enabling the first power conversion device to stop working in the first working mode. For example, the second turn-off instruction may be ID180180A0 instruction 6200941100009411.

As a result, the first stage of charge and discharge of the second power conversion device in the second working mode and the first stage of charge and discharge of the first power conversion device in the first working mode are ended.

When the second power conversion device is controlled to undergo the second stage of charge and discharge in the first working mode and control the first power conversion device to undergo the second stage of charge and discharge in the second working mode, the second relay corresponding to the second power conversion device is controlled to close, and the communication state between the second power conversion device and the control unit 3 is switched from non-communication to communication, so that the control unit 3 can send a first turn-on instruction to the second power conversion device, to enable the second power conversion device to undergo the second stage of charge and discharge in the first working mode. The first turn-on instruction may be an instruction preset in the host computer for enabling the second power conversion device to work in the first working mode.

Then, the second relay is controlled to open, the first relay corresponding to the first power conversion device is controlled to close, and the communication state between the first power conversion device and the control unit 3 is switched from non-communication to communication, so that the control unit 3 can send a second turn-on instruction to the first power conversion device, to enable the first power conversion device to undergo the second stage of charge and discharge in the second working mode. The second turn-on instruction may be an instruction preset in the host computer for enabling the first power conversion device to work in the second working mode.

Therefore, the first power conversion device and the second power conversion device can undergo the second stage of charge and discharge in different working modes. When the second power conversion device works in the first working mode based on the first turn-on instruction, it can receive an AC power from the grid, convert the AC power into a DC power and output it to the first power conversion device. When the first power conversion device works in the second working mode based on the second turn-on instruction, it can receive the DC power output from the second power conversion device, convert the DC power into an AC power and output it to the grid.

In some embodiments, before Step 602 is executed, the host computer may perform communication pre-check on the test system, so as to facilitate troubleshooting of the test system. Exemplarily, the relay may control the first relay corresponding to the first power conversion device to close, and determine whether there is a data change in the life frame. If there is a data change in the life frame, it indicates that the communication of the first power conversion device is normal; otherwise, it indicates that the communication of the first power conversion device is abnormal. Then, the first relay is controlled to open, and the second relay corresponding to the second power conversion device is controlled to close, and whether there is a data change in the life frame is determined. If there is a data change in the life frame, it indicates that the communication of the second power conversion device is normal; otherwise, it indicates that the communication of the second power conversion device is abnormal. Similarly, according to this method, whether the communication of other power conversion devices is normal can be determined.

Step 603: Obtain the test data of the first power conversion device and the second power conversion device when they work in different working modes, and evaluate the first power conversion device and the second power conversion device according to the test data.

When the step is performed, the evaluation unit 4 is connected to the first power conversion device and the second power conversion device respectively through the control unit 3. When the control unit 3 controls the first power conversion device to work in the first working mode and control the second power conversion device to work in the second working mode, the test data of the first power conversion device when working in the first working mode and the test data of the second power conversion device when working in the second working mode can be obtained by control unit 4. When the control unit 3 controls the first power conversion device to work in the second working mode and control the second power conversion device to work in the first working mode, the test data of the first power conversion device when working in the second working mode and the test data of the second power conversion device when working in the first working mode can be obtained by control unit 4. Afterwards, the evaluation unit 4 can evaluate the first power conversion device according to the test data when the first power conversion device works in the first working mode and the test data when the first power conversion device works in the second working mode, and evaluate the second power conversion device according to the test data when the second power conversion device works in the second working mode and the test data when the second power conversion device works in the first working mode. The evaluation of the first power conversion device may be determining whether the first power conversion device is abnormally charged and discharged, and the evaluation of the second power conversion device may be determining whether the second power conversion device is abnormally charged and discharged.

Figure 7:
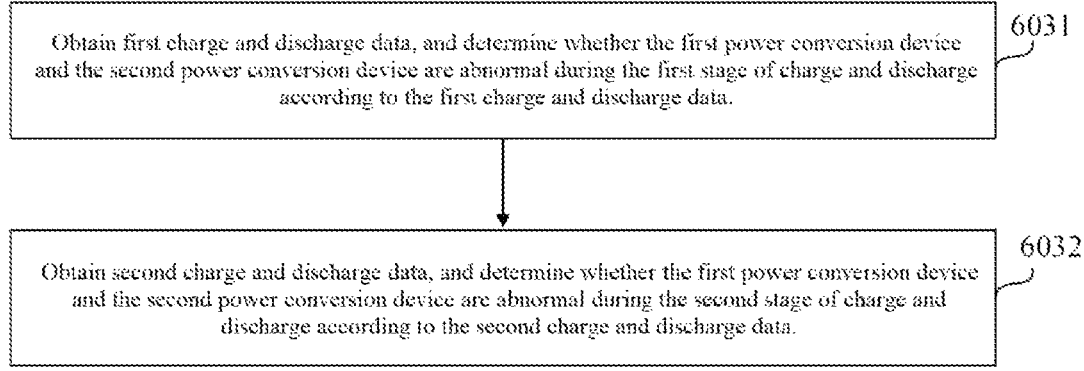
FIG. 7 is a schematic flowchart of evaluating a first power conversion device and a second power conversion device according to obtained test data according to an embodiment of the present application.

In some examples, as shown in FIG. 7, an exemplary implementation of Step 603 may be as follows.

Step 6031: Obtain first charge and discharge data, and determine whether the first power conversion device and the second power conversion device are abnormal during the first stage of charge and discharge according to the first charge and discharge data.

The first charge and discharge data is the test data when the first power conversion device undergoes the first stage of charge and discharge in the first working mode and the test data when the second power conversion device undergoes the first stage of charge and discharge in the second working mode.

It should be noted that due to the relatively large amount of test data, to save the data processing pressure and data storage pressure, the host computer can collect the first charge and discharge data of all power conversion devices in a polling manner at preset time intervals. For example, the first charge and discharge data of all power conversion devices may be collected every 5 minutes.

In some examples, when the first charge and discharge data is obtained, the first relay corresponding to the first power conversion device may be controlled to close, and all test data of the first power conversion device in the first stage of charge and discharge in the first working mode is collected. Then, the first relay is controlled to open, and the second relay corresponding to the second power conversion device is controlled to close, and all test data of the second power conversion device in the first stage of charge and discharge in the second working mode is collected. Of course, the second relay corresponding to the second power conversion device may be controlled to close first, and all test data of the second power conversion device in the first stage of charge and discharge in the second working mode is collected. Then, the second relay is controlled to open, and the first relay corresponding to the first power conversion device is controlled to close, and all test data of the first power conversion device in the first stage of charge and discharge in the first working mode is collected. This is not limited in the embodiment of the present application.

Further, after obtaining the first charge and discharge data, the host computer stores the first charge and discharge data. Of course, the obtained first charge and discharge data may be displayed for check by the technicians. Exemplarily, the first charge and discharge data can be stored and displayed in the form of a table or a graph, so that the storage efficiency is improved, and the intuitiveness and readability of the data is improved.

After the first charge and discharge data is obtained, whether the first power conversion device is abnormal during the first stage of charge and discharge is determined according to the test data when the first power conversion device undergoes the first stage of charge and discharge in the first working mode. Whether the second power conversion device is abnormal during the first stage of charge and discharge is determined according to the test data when the second power conversion device undergoes the first stage of charge and discharge in the second working mode.

It should be noted that an aging configuration table includes thresholds of various aging parameters, and may respectively include a first threshold range of each aging parameter when the power conversion device undergoes the first stage of charge and discharge in the first working mode and the second working mode. The host computer can receive the aging configuration table after starting the test system, and can obtain, based on the aging configuration table, the first threshold range of each aging parameter when the first stage of charge and discharge is performed in the first working mode and the first threshold range of each aging parameter when the first stage of charge and discharge is performed in the second working mode. Then the test data of the first power conversion device in the first stage of charge and discharge in the first working mode, that is, the first charge and discharge data of the first power conversion device is compared with the first threshold range of the corresponding aging parameter when the first stage of charge and discharge is performed in the first working mode to determine whether the first power conversion device is abnormal in the first stage of charge and discharge in the first working mode. The test data of the second power conversion device in the first stage of charge and discharge in the second working mode, that is, the first charge and discharge data of the second power conversion device is compared with the first threshold range of the corresponding aging parameter when the first stage of charge and discharge is performed in the second working mode to determine whether the second power conversion device is abnormal in the first stage of charge and discharge in the second working mode.

For example, if the first charge and discharge data of the first power conversion device goes beyond the first threshold range, it is determined that the first power conversion device is abnormal in the first stage of charge and discharge in the first working mode. When the first charge and discharge data of the second power conversion device goes beyond the first threshold range, it is determined that the second power conversion device is abnormal in the first stage of charge and discharge in the second working mode.

For example, when 2 aging parameters are included, they can be designated as the first aging parameter and the second aging parameter, and the first threshold range includes the first threshold range of the first aging parameter and the first threshold range of the second aging parameter. In this example, if the first aging parameter in the first charge and discharge data of the first power conversion device goes beyond the first threshold range of the first aging parameter, and/or, the second aging parameter in the first charge and discharge data of the first power conversion device goes beyond the first threshold range of the second aging parameter, it is determined that the first power conversion device is abnormal in the first stage of charge and discharge in the first working mode. That is to say, if any aging parameter of the first power conversion device during the first stage of charge and discharge in the first working mode goes beyond the first threshold range corresponding to the parameter, it can be determined that the first power conversion device is abnormal. Similarly, if the first aging parameter in the first charge and discharge data of the second power conversion device goes beyond the first threshold range of the first aging parameter, and/or, the second aging parameter in the first charge and discharge data of the second power conversion device goes beyond the first threshold range of the second aging parameter, it is determined that the second power conversion device is abnormal in the first stage of charge and discharge in the second working mode. That is to say, if any aging parameter of the second power conversion device during the first stage of charge and discharge in the second working mode goes beyond the first threshold range corresponding to the parameter, it can be determined that the second power conversion device is abnormal.

It should be noted that in the present application, whether the first power conversion device is abnormal during the first stage of charge and discharge can be determined first according to the test data of the first power conversion device during the first stage of charge and discharge in the first working module, or whether the second power conversion device is abnormal during the first stage of charge and discharge can be determined first according to the test data of the second power conversion device during the first stage of charge and discharge in the second working module, which is not limited in the embodiment of the present application. If the first power conversion device is determined to be abnormal during the first stage of charge and discharge first, there is no need to determine whether the second power conversion device is abnormal during the first stage of charge and discharge. If the second power conversion device is determined to be abnormal during the first stage of charge and discharge first, there is no need to determine whether the first power conversion device is abnormal during the first stage of charge and discharge. Moreover, in this embodiment, once any one of the first power conversion device and the second power conversion device is determined to be abnormal during the first stage of charge and discharge, the subsequent aging test steps will not be performed.

Step 6032: Obtain second charge and discharge data, and determine whether the first power conversion device and the second power conversion device are abnormal during the second stage of charge and discharge according to the second charge and discharge data.

The second charge and discharge data is the test data when the first power conversion device undergoes the second stage of charge and discharge in the second working mode and the test data when the second power conversion device undergoes the second stage of charge and discharge in the first working mode.

It should be noted that Step 6032 can be implemented immediately after Step (2). In this step, the second charge and discharge data of all the power conversion devices can also be collected at preset time intervals in a polling manner, as shown in Step 6031. For example, the second charge and discharge data of all power conversion devices may be collected every minutes.

In some examples, when the second charge and discharge data is obtained, the first relay corresponding to the first power conversion device may be controlled to close, and all test data of the first power conversion device in the second stage of charge and discharge in the second working mode is collected. Then, the first relay is controlled to open, and the second relay corresponding to the second power conversion device is controlled to close, and all test data of the second power conversion device in the second stage of charge and discharge in the first working mode is collected. Of course, the second relay corresponding to the second power conversion device may be controlled to close first, and all test data of the second power conversion device in the second stage of charge and discharge in the first working mode is collected. Then, the second relay is controlled to open, and the first relay corresponding to the first power conversion device is controlled to close, and all test data of the first power conversion device in the second stage of charge and discharge in the second working mode is collected. This is not limited in the embodiment of the present application.

Further, after obtaining the second charge and discharge data, the host computer stores the second charge and discharge data. Of course, the obtained second charge and discharge data may be displayed for check by the technicians. Exemplarily, the second charge and discharge data can be stored and displayed in the form of a table or a graph, so that the storage efficiency is improved, and the intuitiveness and readability of the data is improved.

After the second charge and discharge data is obtained, whether the first power conversion device is abnormal during the second stage of charge and discharge is determined according to the test data when the first power conversion device undergoes the second stage of charge and discharge in the second working mode. Whether the second power conversion device is abnormal during the second stage of charge and discharge is determined according to the test data when the second power conversion device undergoes the second stage of charge and discharge in the first working mode.

It should be noted that the aging configuration table also includes a threshold of each aging parameter when the power conversion device undergoes the second stage of charge and discharge in the first working mode and the second working mode. The host computer can obtain, based on the aging configuration table, the second threshold range of each aging parameter when the second stage of charge and discharge is performed in the first working mode and the second threshold range of each aging parameter when the second stage of charge and discharge is performed in the second working mode. Then the test data of the first power conversion device in the second stage of charge and discharge in the second working mode, that is, the second charge and discharge data of the first power conversion device is compared with the threshold of the corresponding aging parameter when the second stage of charge and discharge is performed in the second working mode to determine whether the first power conversion device is abnormal in the second stage of charge and discharge in the second working mode. The test data of the second power conversion device in the second stage of charge and discharge in the first working mode, that is, the second charge and discharge data of the second power conversion device is compared with the threshold of the corresponding aging parameter when the second stage of charge and discharge is performed in the first working mode to determine whether the second power conversion device is abnormal in the second stage of charge and discharge in the first working mode.

For example, if the second charge and discharge data of the first power conversion device goes beyond the second threshold range, it is determined that the first power conversion device is abnormal in the second stage of charge and discharge in the second working mode. If the second charge and discharge data of the second power conversion device goes beyond the second threshold range, it is determined that the second power conversion device is abnormal in the second stage of charge and discharge in the first working mode. The specific example is similar to the related example in Step 6031, and no example will be described here.

If it is determined in Step 6031 that the first power conversion device is not abnormal during the first stage of charge and discharge, and it is determined in Step 6032 that the first power conversion device is not abnormal during the second stage of charge and discharge, the first power conversion device is determined to be not failed. Otherwise, the first power conversion device is determined to be a failed product. Similarly, if it is determined in Step 6031 that the second power conversion device is not abnormal during the first stage of charge and discharge, and it is determined in Step 6032 that the second power conversion device is not abnormal during the second stage of charge and discharge, the second power conversion device is determined to be not failed. Otherwise, the second power conversion device is determined to be a failed product.

In some embodiments, the host computer can upload the evaluation results of the first power conversion device and the second power conversion device made according to the test data to an MES system, so that the MES system can supervise the management and control work on the flow line. For the way that the MES system supervises the management and control work on the flow line, reference can be made to the related technologies, which will not be repeated here.

In the embodiments of the present application, the power supply grid is connected to the AC terminal of the first power conversion device, the power supply grid is also connected to the AC terminal of the second power conversion device, and the DC terminal of the first power conversion device is connected to the DC terminal of the second power conversion device. In this way, a test loop is formed by the power supply grid, the first power conversion device and the second power conversion device. Then, the first power conversion device and the second power conversion device are controlled to work simultaneously in different working modes. Finally, test data of the first power conversion device and the second power conversion device when they work in different working modes is obtained, and the first power conversion device and the second power conversion device are evaluated according to the test data. In this test loop, the first power conversion device and the second power conversion device can act as a load and a power source, so no additional DC power supply and load are required during the test, thus saving the investment cost and energy consumption. In addition, the first power conversion device and the second power conversion device work simultaneously in different working modes, so the test can be performed on the first power conversion device and the second power conversion device at the same time, which improves the test efficiency.

Corresponding to the test system for power conversion devices shown in the embodiment of FIG. 3, the embodiment of the present application provides a second test method for power conversion devices.

Different from the embodiment of FIG. 3, the first step of the method comprises connecting a power supply grid respectively to an AC terminal of a first power conversion device in the back-to-back serially connected sequence in this group of power conversion devices and an AC terminal of a last power conversion device in the back-to-back serially connected sequence in this group of power conversion devices, connecting DC terminals of two power conversion devices in each pair of power conversion devices, and connecting AC terminals of two adjacent power conversion devices of two adjacent pairs of power conversion devices.

The second step of the method comprises controlling the odd-numbered and the even-numbered power conversion devices in the serially connected sequence in this group of power conversion devices by the control unit 3 to work simultaneously in different working modes.

In some embodiments, the control unit 3 may control the odd-numbered/even-numbered power conversion devices in the serially connected sequence in this group of power conversion devices to undergo a first stage of charge and discharge in a first working mode, and control the even-numbered/odd-numbered power conversion devices in the serially connected sequence in this group of power conversion devices to undergo a first stage of charge and discharge in a second working mode. It controls the odd-numbered/even-numbered power conversion devices in the serially connected sequence in this group of power conversion devices to undergo a second stage of charge and discharge in the second working mode, and controls the even-numbered/odd-numbered power conversion devices in the serially connected sequence in this group of power conversion devices to undergo a second stage of charge and discharge in the first working mode when the first stage of charge and discharge ends.

The third step of the method comprises obtaining test data when the odd-numbered and the even-numbered power conversion devices in the serially connected sequence in this group of power conversion devices work simultaneously in different working modes, and evaluate the group of power conversion according to the test data.

In some embodiments, as described in Steps 6031 to 6032, first charge and discharge data and second charge and discharge data are obtained, and whether any one of the power conversion devices in this group of power conversion devices is abnormally charged and discharged is determined according to the first charge and discharge data and the second charge and discharge data.

Different from Steps 6031 to 6032, the first charge and discharge data is the test data of the odd-numbered power conversion devices in the serially connected sequence in this group of power conversion devices in the first stage of charge and discharge in the first working mode and the test data of the even-numbered power conversion devices in the serially connected sequence in the first stage of charge and discharge in the second working mode. The second charge and discharge data is the test data of the odd-numbered power conversion devices in the serially connected sequence in this group of power conversion devices in the second stage of charge and discharge in the second working mode and the test data of the even-numbered power conversion devices in the serially connected sequence in the second stage of charge and discharge in the first working mode.

It is to be noted that the test system for power conversion devices shown in the embodiment of FIG. 2 includes a group of power conversion devices, and this group of power conversion devices includes a pair of power conversion devices. In the test method for power conversion devices shown in the embodiment of FIG. 6, it is pointed out that if the first power conversion device or the second power conversion device is abnormal during the first stage of charge and discharge, the first stage of charge and discharge is stopped to end the aging test, and the second stage of charge and discharge is not performed. However, in the test system for power conversion devices shown in the embodiment of FIG. 3, a group of power conversion devices includes multiple pairs of power conversion devices. If a power conversion device is abnormal during the first stage of charge and discharge, not all the first stages of charge and discharge are stopped to end the aging test, but only the first stage of charge and discharge of the power conversion device with abnormal charge and discharge and a power conversion device paired therewith are stopped, and the second stage of charge and discharge of the pair of power conversion devices are performed. The aging test of other pairs of power conversion devices can be carried out normally.

Corresponding to the test system for power conversion devices shown in the embodiment of FIG. 4, the embodiment of the present application provides a third test method for power conversion devices.

Different from the embodiment of FIG. 3, the first step of the method comprises: connecting a power supply grid respectively to an AC terminal of a first power conversion device in each group of power conversion devices in the multiple groups of power conversion devices and an AC terminal of a second power conversion device in each group of power conversion devices, and connecting a DC terminal of the first power conversion device and a DC terminal of the second power conversion device in each group of power conversion devices.

The second step of the method comprises controlling the first power conversion device and the second power conversion device in each group of power conversion devices in the multiple groups of power conversion devices by the control unit 3 to work simultaneously in different working modes.

In some embodiments, the control unit 3 may first control the first power conversion device/the second power conversion device in each group of power conversion devices to undergo a first stage of charge and discharge in a first working mode, and control the second power conversion device/first power conversion device in each group of power conversion devices to undergo a first stage of charge and discharge in a second working mode. It controls the first power conversion device/the second power conversion device in each group of power conversion devices to undergo a second stage of charge and discharge in the second working mode, and controls the second power conversion device/first power conversion device in each group of power conversion devices to undergo a second stage of charge and discharge in the first working mode when the first stage of charge and discharge ends.

It is to be noted that in this embodiment, the first power conversion device in each group is not necessarily the top-ranked power conversion device in the group, and the second power conversion device in each group is not necessarily the bottom-ranked power conversion device in the group. For example, in the example in the embodiment of FIG. 4, the first power conversion device in the first group of power conversion devices may be the top-ranked power conversion device in the first group of power conversion devices, and the first power conversion device in the second group of power conversion devices may be the bottom-ranked power conversion device in the second group of power conversion devices. This is not limited in the embodiment of the present application.

The third step of the method comprises: obtaining test data of the first power conversion device and the second power conversion device in each group of power conversion devices in the multiple groups of power conversion devices when they work simultaneously in different working modes, and evaluating each power conversion device in the multiple groups of power conversion devices according to the test data.

In some embodiments, as described in Steps 6031 to 6032, first charge and discharge data and second charge and discharge data are obtained, and whether each of the power conversion devices in the multiple groups of power conversion devices is abnormally charged and discharged is determined according to the first charge and discharge data and the second charge and discharge data.

Different from Steps 6031 to 6032, the first charge and discharge data is the test data of the first power conversion device in each group of power conversion devices in the multiple groups of power conversion devices in the first stage of charge and discharge in the first working mode and the test data of the second power conversion device in each group of power conversion devices in the first stage of charge and discharge in the second working mode. The second charge and discharge data is the test data of the first power conversion device in each group of power conversion devices in the multiple groups of power conversion devices in the second stage of charge and discharge in the second working mode and the test data of the second power conversion device in each group of power conversion devices in the second stage of charge and discharge in the first working mode.

It is to be noted that the test system for power conversion devices shown in the embodiment of FIG. 4 includes multiple groups of power conversion devices, and each of the multiple groups of power conversion devices includes two back-to-back serially connected power conversion devices as shown in the embodiment of FIG. 2. If a power conversion device is abnormal during the first stage of charge and discharge, not all the first stages of charge and discharge are stopped to end the aging test, but only the first stage of charge and discharge of the power conversion device with abnormal charge and discharge and the power conversion device in the same group therewith are stopped, and the second stage of charge and discharge of this group of power conversion devices are performed. The aging test of other groups of power conversion devices can be carried out normally.

Corresponding to the test system for power conversion devices shown in the embodiment of FIG. 5, the embodiment of the present application provides a fourth test method for power conversion devices.

Different from the embodiment of FIG. 3, the first step of the method comprises connecting a power supply grid respectively to an AC terminal of a first power conversion device in the back-to-back serially connected sequence in each group of power conversion devices in the multiple groups of power conversion devices and an AC terminal of a last power conversion device in the back-to-back serially connected sequence in each group of power conversion devices, connecting DC terminals of two power conversion devices in each pair of power conversion devices in each group of power conversion devices, and connecting AC terminals of two adjacent power conversion devices of two adjacent pairs of power conversion devices in each group of power conversion devices.

The second step of the method comprises controlling the odd-numbered and the even-numbered power conversion devices in the serially connected sequence in each group of power conversion devices in the multiple groups of power conversion devices by the control unit 3 to work simultaneously in different working modes.

In some embodiments, the control unit 3 may control the odd-numbered/even-numbered power conversion devices in the serially connected sequence in each group of power conversion devices to undergo a first stage of charge and discharge in a first working mode, and control the even-numbered/odd-numbered power conversion devices in the serially connected sequence in each group of power conversion devices to undergo a first stage of charge and discharge in a second working mode. It controls the odd-numbered/even-numbered power conversion devices in the serially connected sequence in each group of power conversion devices to undergo a second stage of charge and discharge in the second working mode, and controls the even-numbered/odd-numbered power conversion devices in the serially connected sequence in each group of power conversion devices to undergo a second stage of charge and discharge in the first working mode when the first stage of charge and discharge ends.

The third step of the method comprises obtaining test data of the odd-numbered and the even-numbered power conversion devices in the serially connected sequence in each group of power conversion devices in the multiple groups of power conversion devices when they work in different working modes, and evaluating each power conversion device in the multiple groups of power conversion devices according to the test data.

In some embodiments, as described in Steps 6031 to 6032, first charge and discharge data and second charge and discharge data are obtained, and whether each of the power conversion devices in the multiple groups of power conversion devices is abnormally charged and discharged is determined according to the first charge and discharge data and the second charge and discharge data.

Different from Steps 6031 to 6032, the first charge and discharge data is the test data of the odd-numbered power conversion devices in the serially connected sequence in each group of power conversion devices in the first stage of charge and discharge in the first working mode and the test data of the even-numbered power conversion devices in the serially connected sequence in the first stage of charge and discharge in the second working mode. The second charge and discharge data is the test data of the odd-numbered power conversion devices in the serially connected sequence in each group of power conversion devices in the second stage of charge and discharge in the second working mode and the test data of the even-numbered power conversion devices in the serially connected sequence in the second stage of charge and discharge in the first working mode.

It is to be noted that each group of power conversion devices in the test system shown in the embodiment of FIG. 5 includes multiple pairs of power conversion devices and each pair of power conversion devices in the multiple pairs of power conversion devices includes two back-to-back serially connected power conversion devices. If a power conversion device is abnormal during the first stage of charge and discharge, not all the first stages of charge and discharge are stopped to end the aging test, but only the first stage of charge and discharge of the power conversion device with abnormal charge and discharge and a power conversion device paired therewith are stopped, and the second stage of charge and discharge of the pair of power conversion devices are performed. The aging test of other pairs and other groups of power conversion devices can be carried out normally.

Embodiments of the present application further provides a computer-readable storage medium storing a computer program or instruction. When the computer program or instruction is executed by a processor, the test method for power conversion devices provided in any of the above method embodiments is implemented.

Examples of computer-readable mediums include, but are not limited to, an electronic circuit, a semiconductor memory device, a Read-Only Memory (ROM), a flash memory, an erasable ROM (EROM), a floppy disk, a CD-ROM, an optical disk, a hard disk, an optic fiber medium, a radio frequency (Radio Frequency, RF) link, and the like.

Figure 8:
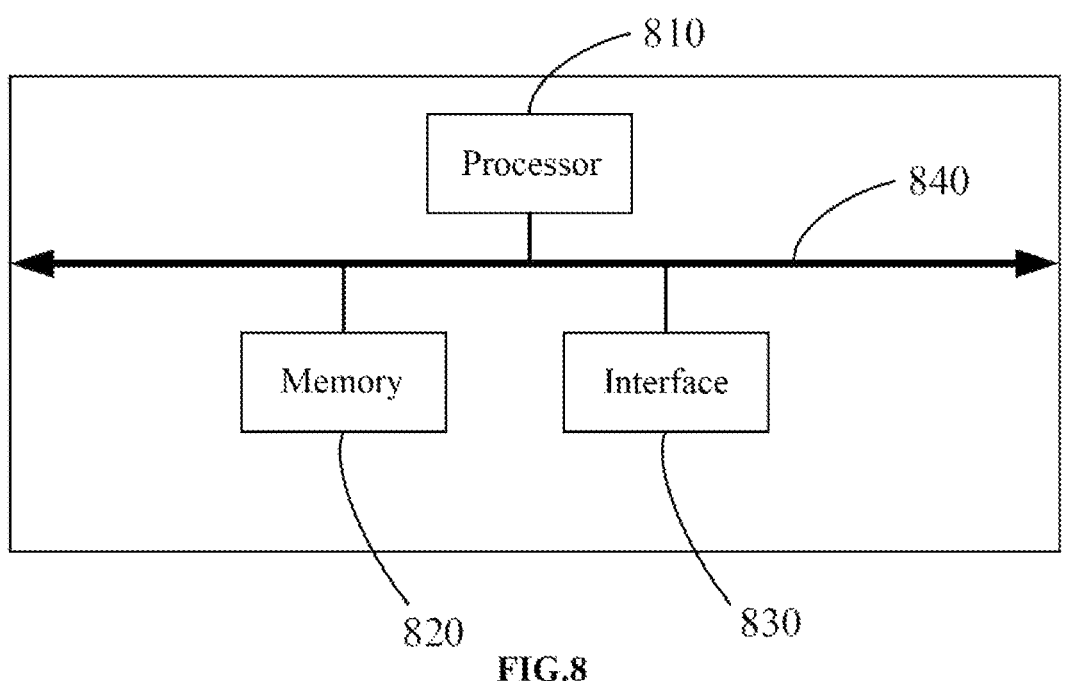
FIG. 8 is a schematic structural diagram of a test apparatus for power conversion devices according to an embodiment of the present application.

FIG. 8 is a schematic structural diagram of another test apparatus for power conversion devices provided in an embodiment of the present application. Referring to FIG. 8, the test apparatus for the power conversion devices includes: a processor 810, a memory 820, and an interface 830. The processor 810, the memory 820, and the interface 830 are connected by a bus 840, which can be implemented by connecting circuits. The memory 820 is configured to store a program, and when the program is called by the processor 810, the method implemented by the test apparatus for power conversion devices in the above embodiment can be accomplished. The interface 830 enables communication with other test apparatuses for power conversion devices, and the interface 830 can communicate with other test apparatuses for power conversion devices through wired connection or wireless connection.

The functions of each unit of the test apparatus for power conversion devices can be achieved by the processor 810 calling the program stored in the memory 820. That is, the test apparatus for power conversion devices includes the processor 810 and the memory 820 used for storing a program, where the program is called by the processor 810 to implement the method in the above method embodiments. The processor 810 here can be a general-purpose processor, or other processors that can call a program. Alternatively, the processor 810 can be configured as one or more integrated circuits implementing the method performed by the test apparatus for power conversion devices in the above embodiments, such as: one or more application specific integrated circuit (ASIC), one or more digital signal processor (DSP), one or more field programmable gate arrays (FPGA) or other programmable logic devices, discrete gate or transistor logic devices, discrete hardware components, etc. For another example, when the unit in the test apparatus for power conversion devices can be implemented by a processor calling a program, the processor 810 can be a general-purpose processor, such as a central processing unit (CPU), a controller, a microcontroller, a single-chip microcomputer or other processor that can call a program. For another example, these units can be integrated and implemented in the form of a system-on-chip.

The number of the memory 820 is not limited, and may be one or more.

The memory 820 includes at least one type of readable storage medium, and the readable storage medium includes non-volatile memory or volatile memory, for example, flash memory, hard disk, multimedia card, card type memory (for example, SD or DX memory, etc.), random access memory (RAM), read-only memory (ROM), erasable programmable read-only memory (EPROM), electrically erasable programmable read-only memory (EEPROM), programmable read-only memory (PROM), magnetic memory, magnetic disk or optical disk, etc. RAM can include Static RAM or Dynamic RAM. In some embodiments, the memory 820 may be an internal memory of the apparatus, for example, the hard disk or memory of the apparatus. In some other embodiments, the memory 820 may also be an external storage device of the apparatus, for example, a plug-in hard disk, a smart media card (SMC), a secure digital (SD) card or a flash card equipped on the apparatus. Of course, the memory 820 may also include both the internal memory and external storage device of the apparatus. In this embodiment, the memory 820 is generally configured to store an operating system and various application software installed in the apparatus, such as program codes of the test method for power conversion devices, and the like. In addition, the memory 820 may also be configured to temporarily store various types of data that have been output or will be output.

The bus 840 may be an industry standard architecture (ISA) bus, a peripheral component interconnect (PCI) bus, an extended industry standard architecture (EISA) bus, or the like. The bus 840 may include an address bus, a data bus, a control bus, or the like. For ease of illustration, only one thick line is used in the figure, but it does not mean that there is only one bus or one type of bus.

The processor 810 is typically configured to control the overall operation of the apparatus. In this embodiment, the memory 820 is used for storing program codes or instructions, where the program codes include computer operation instructions. The processor 810 is configured to execute the program codes or instructions stored in the memory 820 or process data, such as program codes for running the test method for power conversion devices.

In summary, in the embodiment of the present application, the power supply grid is connected to the AC terminal of the first power conversion device, the power supply grid is also connected to the AC terminal of the second power conversion device, and the DC terminal of the first power conversion device is connected to the DC terminal of the second power conversion device. Connected so that a test loop can be formed by the power supply grid, the first power conversion device and the second power conversion device. Then, the control unit 3 can control the first power conversion device and the second power conversion device to work simultaneously in different working modes, and the evaluation unit 4 can obtain the test data of the first power conversion device and the second power conversion device when they work in different working modes, and evaluate the first power conversion device and the second power conversion device according to the test data. In this test loop, the first power conversion device and the second power conversion device can act as a load and a power source, so no additional DC power supply and load are required during the test, thus saving the investment cost and energy consumption. In addition, the first power conversion device and the second power conversion device work simultaneously in different working modes, so the test can be performed on the first power conversion device and the second power conversion device at the same time, which improves the test efficiency.

It will be understood by those skilled in the art that although some of the embodiments herein include some, but not other features included in other embodiments, combinations of features of different embodiments are intended to be embraced in the scope of the present application and form different embodiments. For example, in the claims, any of the claimed embodiments may be used in any combination.

Finally, it should be noted that the above embodiments are merely used for illustrating rather than limiting the technical solutions of the present application. Although the present application has been described in detail with reference to the above various embodiments, those of ordinary skill in the art should understand that the technical solutions described in the above various embodiments can be modified, or some of the technical features therein can be equivalently substituted. However, such modifications or substitutions do not make the essence of the corresponding technical solutions depart from the spirit and scope of the technical solutions of the various embodiments of the present application.

What is claimed is:

1. A system for testing power conversion devices, comprising:
   a first AC input/output section, configured to connect a power supply grid and an AC terminal of a first power conversion device;
   a second AC input/output section, configured to connect the power supply grid and an AC terminal of a second power conversion device, wherein a DC terminal of the first power conversion device is connected to a DC terminal of the second power conversion device;
   a control circuit, configured to control the first power conversion device and the second power conversion device to work simultaneously in different working modes; and
   a processing circuit, configured to obtain test data of the first power conversion device and the second power conversion device when they work in different working modes, and evaluate the first power conversion device and the second power conversion device according to the test data;
   wherein the first power conversion device and the second power conversion device are bidirectional AC/DC power conversion devices, the different working modes comprise a first working mode and a second working mode, the first working mode is an AC input and DC output mode, and the second working mode is a DC input and AC output mode; and
   in controlling the first power conversion device and the second power conversion device to work simultaneously in different working modes, the control circuit is configured to:
   control the first power conversion device to undergo a first stage of charge and discharge in the first working mode, and control the second power conversion device to undergo a first stage of charge and discharge in the second working mode;
   determine whether the first power conversion device or the second power conversion device is abnormal during the first stage of charge and discharge according to the test data; and
   when it is determined that the first power conversion device and the second power conversion device are not abnormal during the first stage of charge and discharge, and when the first stage of charge and discharge ends, control the first power conversion device to undergo a second stage of charge and discharge in the second working mode, and control the second power conversion device to undergo a second stage of charge and discharge in the first working mode.

2. The system according to claim 1, wherein
the control circuit comprises a relay control board and a plurality of relays;
the plurality of relays are arranged on the relay control board;
the first power conversion device and the second power conversion device are respectively connected to different relays; and
the relays are configured to switch communication state of the first power conversion device and the second power conversion device.

3. A method for testing power conversion devices, performed by a system that comprises a first AC input/output section, a second AC input/output section a control circuit and a processing circuit, the method comprising:
connecting a power supply grid respectively to an AC terminal of a first power conversion device and an AC terminal of a second power conversion device;
connecting a DC terminal of the first power conversion device to a DC terminal of the second power conversion device;
controlling, by the control circuit, the first power conversion device and the second power conversion device to work simultaneously in different working modes; and
obtaining, by the processing circuit, test data of the first power conversion device and the second power conversion device when they work in different working modes, and evaluating the first power conversion device and the second power conversion device according to the test data:
wherein the first power conversion device and the second power conversion device are bidirectional AC/DC power conversion devices, the different working modes comprise a first working mode and a second working mode the first working mode is an AC input and DC output mode, and the second working mode is a DC input and AC output mode; and
wherein controlling the first power conversion device and the second power conversion device to work simultaneously in different working modes comprises:
controlling the first power conversion device to undergo a first stage of charge and discharge in the first working mode and controlling the second power conversion device to undergo a first stage of charge and discharge in the second working mode;
determining whether the first power conversion device or the second power conversion device is abnormal during the first stage of charge and discharge according to the test data; and
when it is determined that the first power conversion device and the second power conversion device are not abnormal during the first stage of charge and discharge, and when the first stage of charge and discharge ends, controlling the first power conversion device to undergo a second stage of charge and discharge in the second working mode, and controlling the second power conversion device to undergo a second stage of charge and discharge in the first working mode.

4. The method according to claim 3, wherein
the control circuit comprises a relay control board and a plurality of relays;
the plurality of relays are arranged on the relay control board;
the first power conversion device and the second power conversion device are respectively connected to different relays; and
the relays are configured to switch communication state of the first power conversion device and the second power conversion device.

5. The method according to claim 3, wherein controlling the first power conversion device to undergo a first stage of charge and discharge in the first working mode and controlling the second power conversion device to undergo a first stage of charge and discharge in the second working mode comprise:
controlling a first relay corresponding to the first power conversion device to close, and sending a first turn-on instruction to the first power conversion device, to enable the first power conversion device to undergo the first stage of charge and discharge in the first working mode; and
controlling the first relay to open, controlling a second relay corresponding to the second power conversion device to close, and sending a second turn-on instruction to the second power conversion device, to enable the second power conversion device to undergo the first stage of charge and discharge in the second working mode.

6. The method according to claim 3, wherein controlling the first power conversion device to undergo a second stage of charge and discharge in the second working mode and controlling the second power conversion device to undergo a second stage of charge and discharge in the first working mode comprise:
controlling the second power conversion device to stop the first stage of charge and discharge in the second working mode, and controlling the first power conversion device to stop the first stage of charge and discharge in first working mode;
sending a first turn-on instruction to the second power conversion device, to enable the second power conversion device to undergo the second stage of charge and discharge in the first working mode; and
sending a second turn-on instruction to the first power conversion device, to enable the first power conversion device to undergo the second stage of charge and discharge in the second working mode.

7. The method according to claim 6, wherein controlling the second power conversion device to stop the first stage of charge and discharge in the second working mode, and controlling the first power conversion device to stop the first stage of charge and discharge in the first working mode comprise:
controlling the second relay corresponding to the second power conversion device to close, and sending a first turn-off instruction to the second power conversion device, to enable the second power conversion device to stop the first stage of charge and discharge in the second working mode; and
controlling the second relay to open, controlling the first relay corresponding to the first power conversion device to close, and sending a second turn-off instruction to the first power conversion device, to enable the first power conversion device to stop the first stage of charge and discharge in the first working mode.

8. The method according to claim 3, wherein obtaining test data of the first power conversion device and the second power conversion device when they work in different working modes and evaluating the first power conversion device and the second power conversion device according to the test data comprise;

obtaining first charge and discharge data, and determining whether the first power conversion device and the second power conversion device are abnormal during the first stage of charge and discharge according to the first charge and discharge data, wherein the first charge and discharge data is test data of the first power conversion device in the first stage of charge and discharge in the first working mode and test data of the second power conversion device in the first stage of charge and discharge in the second working mode; and obtaining second charge and discharge data, and determining whether the first power conversion device and the second power conversion device are abnormal during the second stage of charge and discharge according to the second charge and discharge data, wherein the second charge and discharge data is test data of the first power conversion device in the second stage of charge and discharge in the second working mode and test data of the second power conversion device in the second stage of charge and discharge in the first working mode.

9. The method according to claim 8, wherein determining whether the first power conversion device and the second power conversion device are abnormal in the first stage of charge and discharge according to the first charge and discharge data comprises:

when the first charge and discharge data of the first power conversion device goes beyond a first threshold range, determining that the first power conversion device is abnormal in the first stage of charge and discharge; and when the first charge and discharge data of the second power conversion device goes beyond a first threshold range, determining that the second power conversion device is abnormal in the first stage of charge and discharge.

10. A non-transitory computer-readable storage medium storing a computer program thereon for execution by a processor to implement the method for testing power conversion devices according to claim 3.

11. An electronic device, comprising:

a processor, and a memory for storing instructions executable by the processor;

wherein by executing the instructions, the processor is configured to perform a method for testing power conversion devices that comprises:

connecting a power supply grid respectively to an AC terminal of a first power conversion device and an AC terminal of a second power conversion device;

connecting a DC terminal of the first power conversion device to a DC terminal of the second power conversion device;

controlling the first power conversion device and the second power conversion device to work simultaneously in different working modes; and obtaining test data of the first power conversion device and the second power conversion device when they work in different working modes, and evaluating the first power conversion device and the second power conversion device according to the test data;

wherein the first power conversion device and the second power conversion device are bidirectional AC/DC power conversion devices, the different working modes comprise a first working mode and a second working mode, the first working mode is an AC input and DC output mode, and the second working mode is a DC input and AC output mode; and wherein controlling the first power conversion device and the second power conversion device to work simultaneously in different working modes comprises:

controlling the first power conversion device to undergo a first stage of charge and discharge in the first working mode, and controlling the second power conversion device to undergo a first stage of charge and discharge in the second working mode;

determining whether the first power conversion device or the second power conversion device is abnormal during the first stage of charge and discharge according to the test data; and when it is determined that the first power conversion device and the second power conversion device are not abnormal during the first stage of charge and discharge, and when the first stage of charge and discharge ends, controlling the first power conversion device to undergo a second stage of charge and discharge in the second working mode, and controlling the second power conversion device to undergo a second stage of charge and discharge in the first working mode.

* * * * *

UNITED STATES PATENT AND TRADEMARK OFFICE
CERTIFICATE OF CORRECTION

| | | |
|---|---|---|
| PATENT NO. | : 12,392,844 B2 | Page 1 of 1 |
| APPLICATION NO. | : 18/310065 | |
| DATED | : August 19, 2025 | |
| INVENTOR(S) | : Chunfa Wang et al. | |

It is certified that error appears in the above-identified patent and that said Letters Patent is hereby corrected as shown below:

On the Title Page

Please insert the following:
--(30) Foreign Application Priority Data
July 31, 2021 (CN) ...................... 202110877278.7--

Signed and Sealed this
Seventh Day of October, 2025

John A. Squires
*Director of the United States Patent and Trademark Office*